US012616009B2

(12) United States Patent
Seo et al.

(10) Patent No.: US 12,616,009 B2
(45) Date of Patent: Apr. 28, 2026

(54) INTEGRATED CIRCUIT DEVICE

(71) Applicant: Samsung Electronics Co., Ltd.,
Suwon-si (KR)

(72) Inventors: Donghee Seo, Suwon-si (KR);
Rakhwan Kim, Suwon-si (KR);
Jeongik Kim, Suwon-si (KR);
Chunghwan Shin, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 410 days.

(21) Appl. No.: 18/339,569

(22) Filed: Jun. 22, 2023

(65) Prior Publication Data

US 2024/0178061 A1     May 30, 2024

(30) Foreign Application Priority Data

Nov. 30, 2022     (KR) ........................ 10-2022-0165106

(51) Int. Cl.
*H01L 21/768*     (2006.01)
*H01L 23/522*     (2006.01)
*H01L 23/532*     (2006.01)
(52) U.S. Cl.
CPC .... *H01L 21/76876* (2013.01); *H01L 21/7684*
(2013.01); *H01L 21/76846* (2013.01); *H01L*
*23/5226* (2013.01); *H01L 23/53266* (2013.01)
(58) Field of Classification Search
CPC ........... H01L 21/76876; H01L 21/7684; H01L
21/76846; H01L 23/5226; H01L
23/53266;

(Continued)

(56) References Cited

U.S. PATENT DOCUMENTS 8,742,592 B2     6/2014   Wakatsuki et al.
11,158,539 B2   10/2021   Wang et al.
(Continued)

FOREIGN PATENT DOCUMENTS

KR     2008/0029664 A     4/2008
TW       202207310 A     2/2022
TW       202243029 A    11/2022

OTHER PUBLICATIONS

Extended European Search Report dated Apr. 30, 2024 for corre-
sponding European Patent Application No. 23209729.5.

(Continued)

*Primary Examiner* — Karen Kusumakar
(74) *Attorney, Agent, or Firm* — HARNESS, DICKEY &
PIERCE, P.L.C.

(57) ABSTRACT

An integrated circuit device includes a middle insulating
structure on a substrate, a first contact structure passing
through the middle insulating structure and extending by a
first vertical length from a top surface of the middle insu-
lating structure toward the substrate, and a second contact
structure passing through the middle insulating structure.
The middle insulating structure may have a top surface
extending in a lateral direction at a first vertical level. The
second contact structure may extend by a second vertical
length greater than the first vertical length from the top
surface of the middle insulating structure toward the sub-
strate. The first contact structure may have a first top surface
extending planar along an extension line of the top surface
of the middle insulating structure. The second contact struc-
ture may have a second top surface, which may be convex
in a direction away from the substrate.

20 Claims, 36 Drawing Sheets

(58) Field of Classification Search
CPC ........... H01L 21/2855; H01L 21/28556; H01L 23/485; H01L 21/28518; H01L 21/76805; H01L 21/76843; H01L 23/528; H01L 21/76871; H01L 21/76877; H01L 23/5283; H01L 23/53209; H10D 84/834; H10D 84/0128; H10D 84/0158; H10D 84/0149; H10D 84/83
See application file for complete search history.

(56) References Cited

U.S. PATENT DOCUMENTS

| | | | |
|---|---|---|---|
| 2017/0125354 A1 | 5/2017 | Zhang et al. | |
| 2018/0308751 A1* | 10/2018 | Wang ................. | H01L 21/7684 |
| 2021/0098376 A1 | 4/2021 | Lin et al. | |
| 2021/0407925 A1 | 12/2021 | Chang et al. | |
| 2022/0037510 A1* | 2/2022 | Cheng ................. | H10D 84/013 |
| 2022/0052168 A1 | 2/2022 | Chang et al. | |
| 2022/0068709 A1 | 3/2022 | Wang et al. | |
| 2022/0223526 A1* | 7/2022 | Min ..................... | H01L 23/535 |
| 2022/0254927 A1 | 8/2022 | Cheng et al. | |
| 2022/0352338 A1 | 11/2022 | Hsiung et al. | |

OTHER PUBLICATIONS

Taiwanese Office Action dated Jan. 22, 2026 for corresponding Taiwanese Patent Application No. 112145444 and its English-language translation (Machine Translate).

\* cited by examiner

Y1 – Y1'

Y3 – Y3'

Y1 – Y1'

X1 – X1'

DGS { D126
      D124 — 118
      D122

104

104

104

N3 }
N2 } NSS
N1 }

FT

R1

F1

102

Z
Y ⊗ → X

X1 – X1'

Y1 − Y1'

X1 – X1'

X1 – X1'

X1 – X1'

X1 – X1'

INTEGRATED CIRCUIT DEVICE

CROSS-REFERENCE TO RELATED APPLICATION

This application is based on and claims priority under 35 U.S.C. § 119 to Korean Patent Application No. 10-2022-0165106, filed on Nov. 30, 2022, in the Korean Intellectual Property Office, the disclosure of which is incorporated by reference herein in its entirety.

BACKGROUND

Inventive concepts relate to an integrated circuit (IC) device, and more particularly, to an IC device including contact structures.

Due to the development of electronics technology, the downscaling of IC devices has rapidly progressed. Thus, planar sizes of contact structures included in an IC device have been gradually reduced, and aspect ratios of the contact structures have gradually increased. Accordingly, it is necessary to develop IC devices having a structure capable of improving the electrical properties and reliability of the contact structures.

SUMMARY

Inventive concepts provide an integrated circuit (IC) device having a structure capable of improving the electrical properties and reliability of contact structures.

According to an embodiment of inventive concepts, an IC device may include a substrate; a middle insulating structure on the substrate, the middle insulating structure having a top surface extending in a lateral direction at a first vertical level on the substrate; a first contact structure passing through the middle insulating structure in a vertical direction, the first contact structure extending by a first vertical length from a top surface of the middle insulating structure toward the substrate; and a second contact structure spaced apart from the first contact structure in the lateral direction, the second contact structure passing through the middle insulating structure in the vertical direction, and the second contact structure extending by a second vertical length from the top surface of the middle insulating structure toward the substrate. The second vertical length may be greater than the first vertical length. The first contact structure may have a first top surface extending planar along an extension line of the top surface of the middle insulating structure. The second contact structure may have a second top surface. The second top surface may be convex from the top surface of the middle insulating structure in a direction away from the substrate.

According to an embodiment of inventive concepts, an IC device may include a substrate including a fin-type active region protruding from the substrate; a source/drain region on the fin-type active region; a gate line on the fin-type active region, the gate line extending in a direction intersecting the fin-type active region; a lower insulating structure covering the source/drain region; a source/drain contact passing through the lower insulating structure in a vertical direction, the source/drain contact being connected to the source/drain region; a capping insulating pattern covering a top surface of the gate line; a middle insulating structure on the source/drain contact and the capping insulating pattern; a first contact structure passing through the middle insulating structure in the vertical direction, the first contact structure being connected to the source/drain contact; and a second contact structure passing through the middle insulating structure and the capping insulating pattern in the vertical direction, the second contact being be connected to the gate line. The first contact structure may have a first top surface extending planar in an extension line of a top surface of the middle insulating structure. The second contact structure may have a second top surface. The second top surface may be convex from the top surface of the middle insulating structure in a direction away from the substrate.

According to an embodiment of inventive concepts, an IC device may include a substrate; a source/drain region on the substrate; a gate line on the substrate; a capping insulating pattern covering a top surface of the gate line; a source/drain contact connected to the source/drain region; a middle insulating structure on the source/drain contact and the capping insulating pattern; a first contact structure passing through the middle insulating structure, the first contact structure being connected to the source/drain contact; and a second contact structure passing through the middle insulating structure and the capping insulating pattern, the second contact structure being connected to the gate line. The first contact structure may include a first tungsten liner in contact with the middle insulating structure and a first tungsten plug having a bottom surface and sidewalls in contact with the first tungsten liner. The first contact structure may have a first top surface extending planar along an extension line of a top surface of the middle insulating structure. The second contact structure may include a second tungsten liner in contact with the middle insulating structure and the capping insulating pattern, a second tungsten plug having a bottom surface and sidewalls surrounded by the second tungsten liner, and a tungsten nucleation layer between the second tungsten liner and the second tungsten plug. The second contact structure may have a second top surface. The second top surface may be convex from the top surface of the middle insulating structure in a direction away from the substrate, and nonmetal or semimetal elements may be irregularly dispersed in the tungsten nucleation layer.

BRIEF DESCRIPTION OF THE DRAWINGS

Embodiments of inventive concepts will be more clearly understood from the following detailed description taken in conjunction with the accompanying drawings in which:

FIGS. 7A to 17 are cross-sectional views of a process sequence of a method of manufacturing an IC device, according to embodiments, wherein FIGS. 7A, 8A, 9A, and 10 to 17 are cross-sectional views of an example sectional structure of a portion corresponding to the cross-section taken along line X1-X1' of FIG. 1, according to a process sequence.

DETAILED DESCRIPTION

Figure 1:
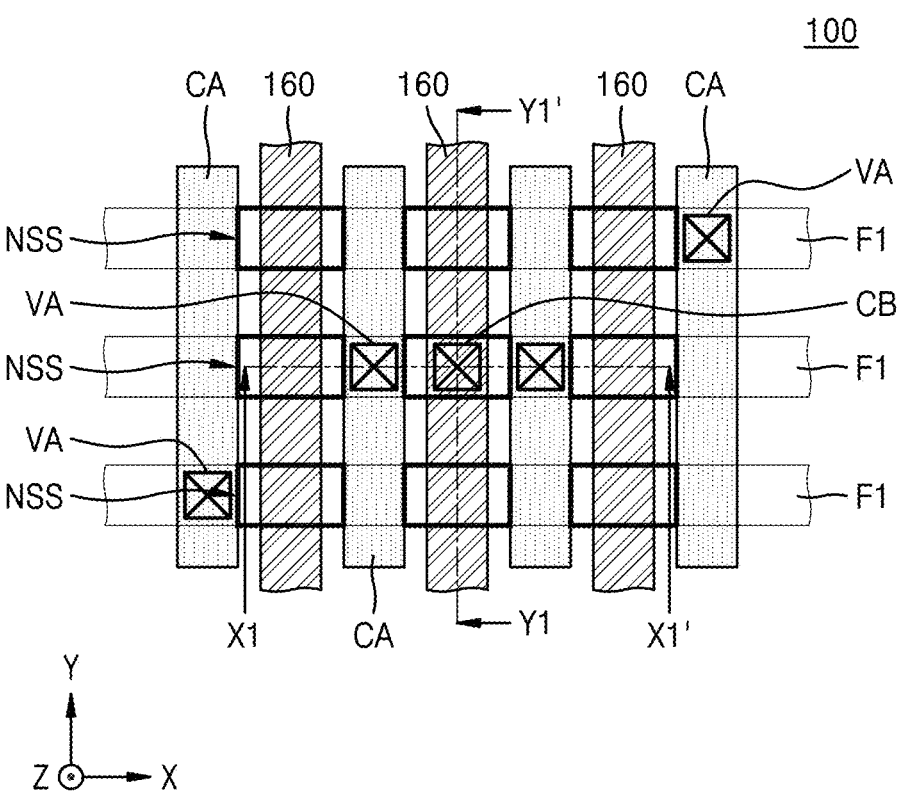
FIG. 1 is a plan layout diagram of an integrated circuit (IC) device according to embodiments.

Hereinafter, embodiments will be described in detail with reference to the accompanying drawings. The same reference numerals are used to denote the same elements in the drawings, and repeated descriptions thereof are omitted.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Figure 2A:
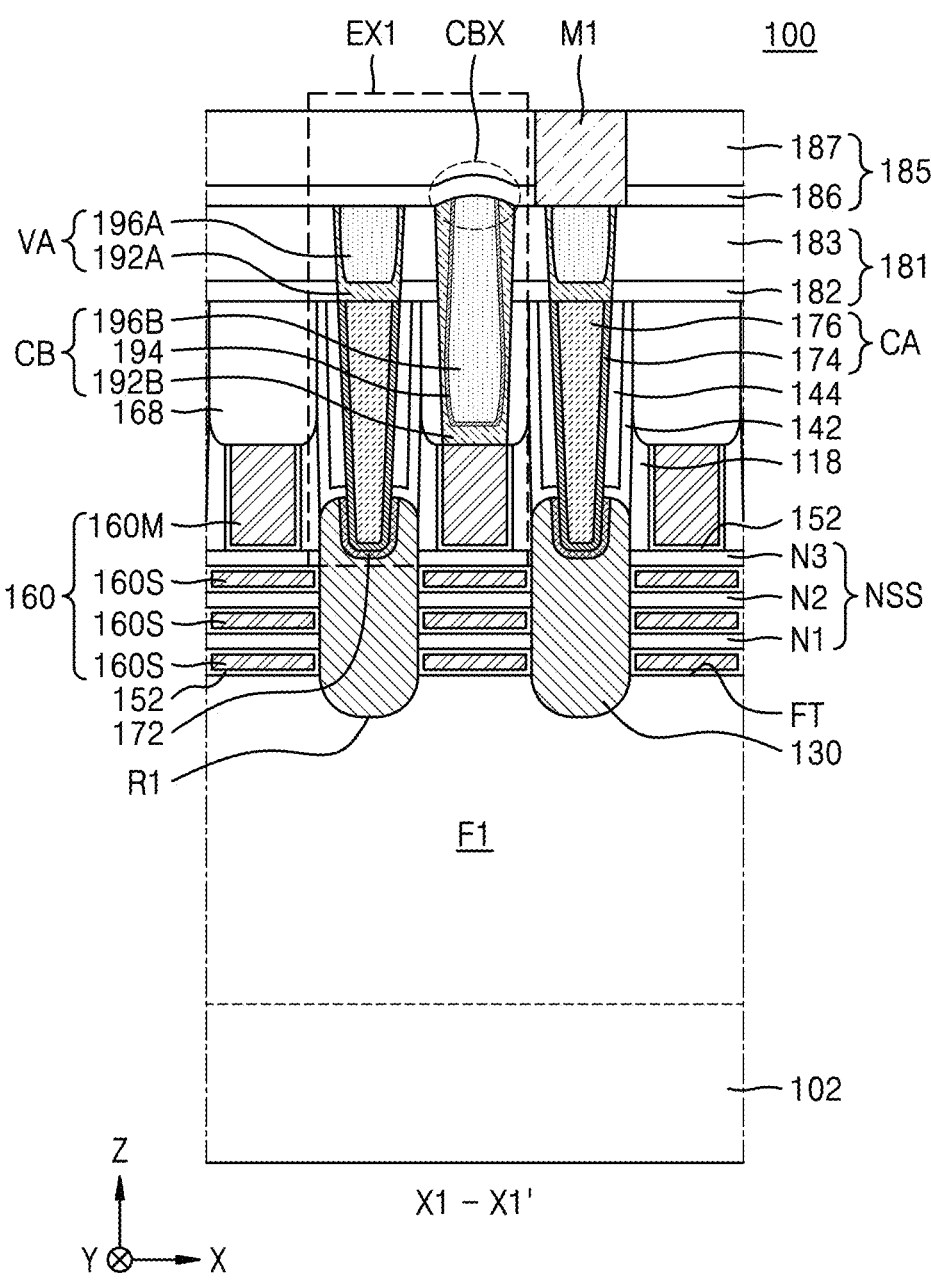
FIG. 2A is a cross-sectional view taken along line X1-X1' of FIG. 1.
Figure 2B:
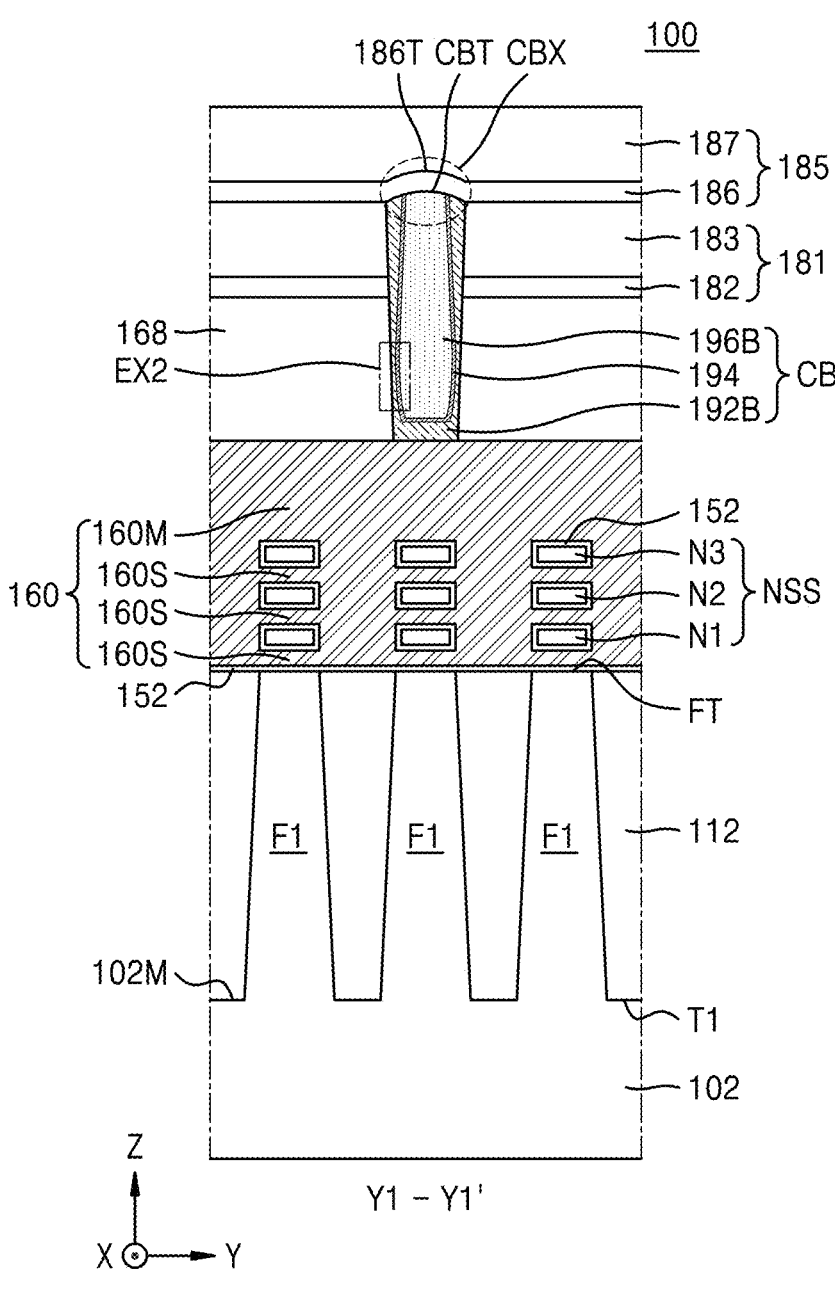
FIG. 2B is a cross-sectional view taken along line Y1-Y1' of FIG. 1.
Figure 2C:
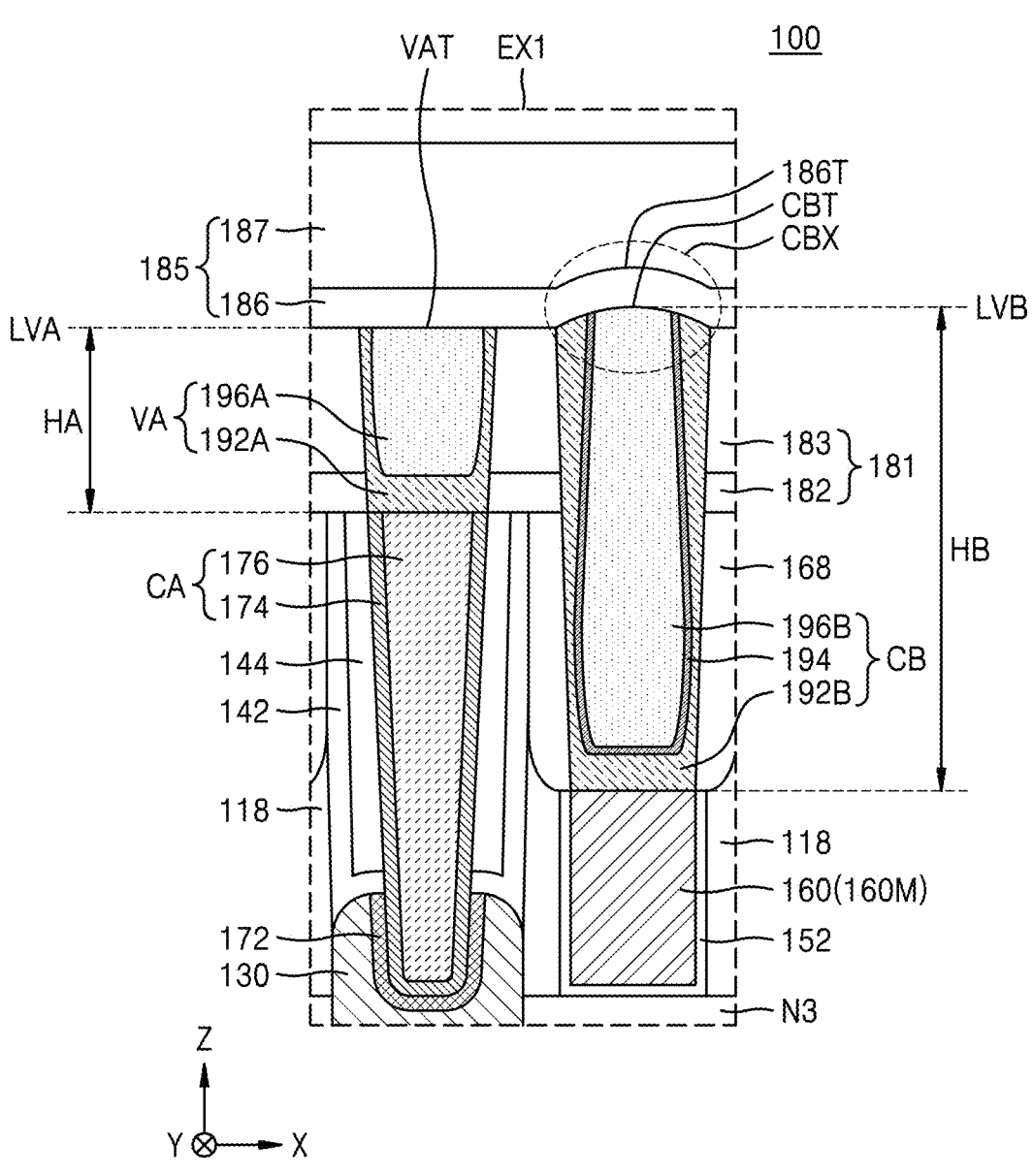
FIG. 2C is an enlarged cross-sectional view of portion "EX1" of FIG. 2A.
Figure 2D:
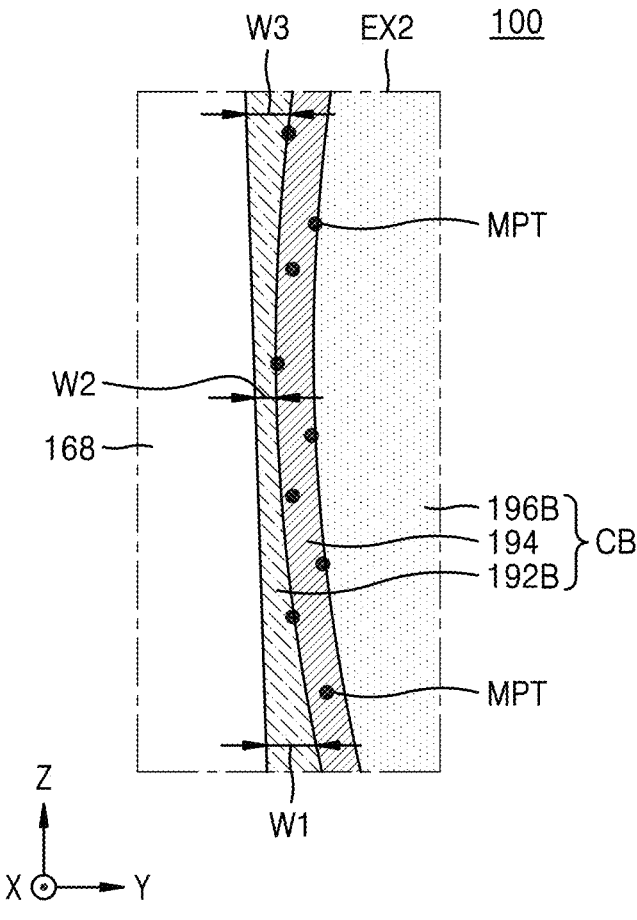
FIG. 2D is an enlarged cross-sectional view of portion "EX2" of FIG. 2B.
Figure 2E:
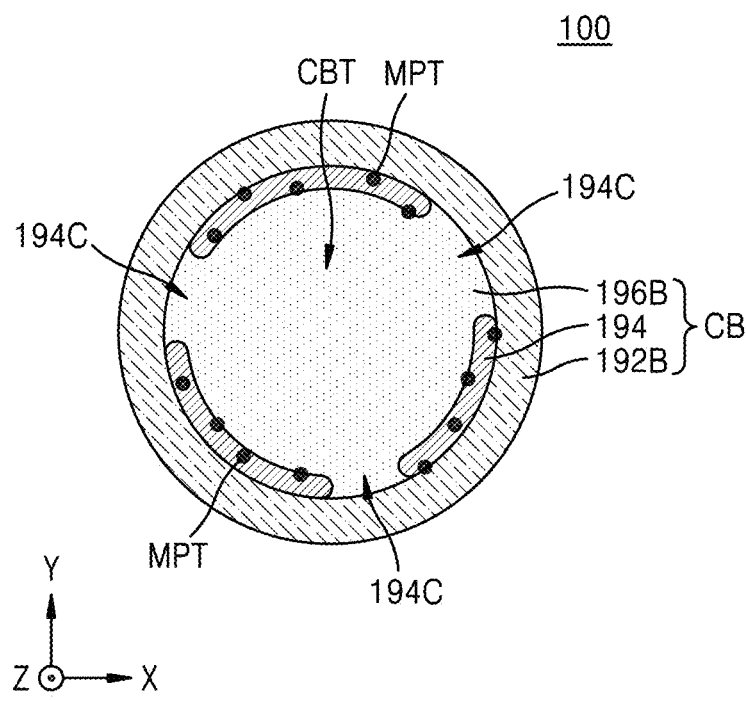
FIG. 2E is a plan view of a top surface of a second contact structure included in the IC device.

FIG. 1 is a plan layout diagram of an integrated circuit (IC) device 100 according to embodiments. FIG. 2A is a cross-sectional view taken along line X1-X1' of FIG. 1. FIG. 2B is a cross-sectional view taken along line Y1-Y1' of FIG. 1. FIG. 2C is an enlarged cross-sectional view of portion "EX1" of FIG. 2A. FIG. 2D is an enlarged cross-sectional view of portion "EX2" of FIG. 2B. FIG. 2E is a plan view of a top surface of a second contact structure CB included in the IC device 100.

The IC device 100 including a field-effect transistor (FET) having a gate-all-around structure including an active region of a nanowire or nanosheet type and a gate surrounding the active region is described with reference to FIGS. 1 and 2A to 2E.

Referring to FIGS. 1 and 2A to 2E, the IC device 100 may include a plurality of fin-type active regions F1 and a plurality of nanosheet stacks NSS. The plurality of fin-type active regions F1 may protrude over a substrate 102 and extend long in a first lateral direction (X direction). The plurality of nanosheet stacks NSS may be over and apart from the plurality of fin-type active regions F1 in a vertical direction (Z direction) and face fin top surfaces FT of the plurality of fin-type active regions F1, respectively. As used herein, the term "nanosheet" refers to a conductive structure having a cross-section that is substantially perpendicular to a direction in which current flows. The nanosheet may be interpreted as including a nanowire.

A trench T1 defining the plurality of fin-type active regions F1 may be formed in the substrate 102. The trench T1 may be filled by a device isolation film 112. The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure. The device isolation film 112 may include an oxide film, a nitride film, or a combination thereof.

A plurality of gate lines 160 may be on the plurality of fin-type active regions F1. Each of the plurality of gate lines 160 may extend long in a second lateral direction (Y direction), which intersects with the first lateral direction (X direction).

A plurality of nanosheet stacks NSS may be respectively on fin top surfaces FT of the plurality of fin-type active regions F1 in regions where the plurality of fin-type active regions F1 intersect with the plurality of gate lines 160. Each of the plurality of nanosheet stacks NSS may include at least one nanosheet, which is apart from the fin top surface FT of the fin-type active region F1 in the vertical direction (Z direction) and faces the fin top surface FT of the fin-type active region F1.

As shown in FIGS. 2A and 2B, each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-directional distances) from the fin top surface FT of the fin-type active region F1. Each of the plurality of gate lines 160 may surround the first to third nanosheets N1, N2, and N3, which overlap in the vertical direction (Z direction) and are included in the nanosheet stack NSS.

Although FIGS. 1 and 2A illustrate a case in which the nanosheet stack NSS has a substantially rectangular planar shape, embodiments of inventive concepts are not limited thereto. The nanosheet stack NSS may have other planar shapes according to a planar shape of each of the fin-type active region F1 and the gate line 160.

Each of the first to third nanosheets N1, N2, and N3 included in the nanosheet stack NSS may function as a channel region. In embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction).

As shown in FIG. 2A, the first to third nanosheets N1, N2, and N3 included in one nanosheet stack NSS may have the same size or similar sizes in the first lateral direction (X direction). In other embodiments, differently from that shown in FIG. 2A, at least some of the first to third nanosheets N1, N2, and N3 included in one nanosheet stack NSS may have different sizes in the first lateral direction (X direction).

As shown in FIGS. 2A and 2B, each of the plurality of gate lines 160 may include a main gate portion 160M and a plurality of sub-gate portions 160S. The main gate portion 160M may cover a top surface of the nanosheet stack NSS and extend long in the second lateral direction (Y direction). The plurality of sub-gate portions 160S may be integrally connected to the main gate portion 160M and respectively arranged between the first to third nanosheets N1, N2, and N3 and between the first nanosheet N1 and the fin-type active region F1. In the vertical direction (Z direction), a thickness of each of the plurality of sub-gate portions 160S may be less than a thickness of the main gate portion 160M.

As shown in FIG. 2A, a plurality of recesses R1 may be formed in the fin-type active region F1. A lowermost surface of each of the plurality of recesses R1 may be at a lower vertical level than the fin top surface FT of the fin-type active region F1. As used herein, the term "vertical level" refers to a distance from a main surface 102M of the substrate 102 in a vertical direction (Z direction or −Z direction).

As shown in FIG. 2A, a plurality of source/drain regions 130 may be inside the plurality of recesses R1, respectively. Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a constituent material of the plurality of gate lines 160 is not limited thereto. Each of the plurality of gate lines 160 may further include a gap-fill metal film. The gap-fill metal film may include a tungsten (W) film or an aluminum (Al) film. In embodiments, each of the plurality of gate lines 160 may include a TiN film, a stack structure of TiAlC/TiN/W, a stack structure of TiN/TaN/TiAlC/TiN/W, or a stack structure of TiN/TaN/TiN/TiAlC/TiN/W, without being limited thereto.

A gate dielectric film 152 may be between the nanosheet stack NSS and the gate line 160. In embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In embodiments, the interface dielectric film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, without being limited thereto.

As shown in FIGS. 2A and 2B, a top surface of each of the gate dielectric film 152 and the gate line 160 may be covered by a capping insulating pattern 168. The capping insulating pattern 168 may be in contact with the top surface of each of the gate dielectric film 152 and the gate line 160. The capping insulating pattern 168 may include a silicon nitride film.

Both sidewalls of each of the gate line 160 and the capping insulating pattern 168 may be covered by insulating spacers 118. The insulating spacers 118 may cover both sidewalls of the main gate portion 160M on the top surfaces of the plurality of nanosheet stacks NSS. The insulating spacers 118 may be apart from the gate line 160 with the gate dielectric film 152 therebetween. The insulating spacer 118 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A plurality of insulating spacers 118 and the plurality of source/drain regions 130 may be covered by an insulating liner 142 on the substrate 102. The insulating liner 142 may include silicon nitride (SiN), silicon oxide (SiO), SiCN, SiBN, SiON, SiOCN, SiBCN, SiOC, or a combination thereof. In embodiments, the insulating liner 142 may be omitted. An inter-gate dielectric film 144 may be on the insulating liner 142. The inter-gate dielectric film 144 may include a silicon nitride film, a silicon oxide film, a SiON film, a SiOCN film, or a combination thereof. When the insulating liner 142 is omitted, the inter-gate dielectric film 144 may be in contact with the plurality of source/drain regions 130. As used herein, the insulating liner 142 and the inter-gate dielectric film 144 may constitute a lower insulating structure covering the plurality of source/drain regions 130.

Both sidewalls of each of the plurality of sub-gate portions 160S may be apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively on the fin top surfaces FT of the plurality of fin-type active regions F1 in regions where the plurality of fin-type active regions F1 intersect with the plurality of gate lines 160. Each of the plurality of nanosheet stacks NSS may be apart from the fin-type active region F1 and face the fin top surface FT of the fin-type active region F1. On the substrate 102, a plurality of nanosheet transistors may be formed in portions where the plurality of fin-type active regions F1 intersect with the plurality of gate lines 160.

Although FIGS. 1 and 2A illustrate a case in which the nanosheet stack NSS has a substantially rectangular planar shape, embodiments of inventive concepts are not limited thereto. The nanosheet stack NSS may have other planar shapes according to a planar shape of each of the fin-type active region F1 and the gate line 160. The present embodiment pertains to a configuration in which the plurality of nanosheet stacks NSS and the plurality of gate lines 160 are formed on one fin-type active region F1, and the plurality of nanosheet stacks NSS are arranged in a line in the first lateral direction (X direction) on one fin-type active region F1. However, according to embodiments of inventive concepts, the number of nanosheet stacks NSS on one fin-type active region F1 is not specifically limited. For example, one nanosheet stack NSS may be formed on one fin-type active region F1. The present embodiment illustrates an example in which each of the plurality of nanosheet stacks NSS includes three nanosheets, but embodiments of inventive concepts are not limited thereto. For example, the nanosheet stack NSS may include at least one nanosheet, and the number of nanosheets included in the nanosheet stack NSS is not specifically limited.

Each of the first to third nanosheets N1, N2, and N3 included in the nanosheet stack NSS may function as a channel region. In embodiments, each of the first to third nanosheets N1, N2, and N3 included in the nanosheet stack NSS may include a Si layer, a SiGe layer, or a combination thereof.

A metal silicide film 172 may be on a top surface of each of the plurality of source/drain regions 130. The metal silicide film 172 may include a metal, which includes titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). For example, the metal silicide film 172 may include titanium silicide, without being limited thereto.

An insulating liner 142 and an inter-gate dielectric film 144 may be sequentially arranged on the plurality of source/drain regions 130 and the plurality of metal silicide films 172. The insulating liner 142 and the inter-gate dielectric film 144 may constitute a lower insulating structure. In other embodiments, the insulating liner 142 may include silicon nitride (SiN), SiCN, SiBN, SiON, SiOCN, SiBCN, or a combination thereof, without being limited thereto. The inter-gate dielectric film 144 may include a silicon oxide film, without being limited thereto.

A plurality of source/drain contacts CA may be on the plurality of source/drain regions 130. Each of the plurality of source/drain contacts CA may pass through the inter-gate dielectric film 144 and the insulating liner 142 in the vertical direction (Z direction) and be in contact with the metal silicide film 172. Each of the plurality of source/drain contacts CA may be electrically connectable to the source/drain region 130 through the metal silicide film 172. Each of the plurality of source/drain contacts CA may be apart from the main gate portion 160M with the insulating spacer 118 therebetween in the first lateral direction (X direction).

Each of the plurality of source/drain contacts CA may include a conductive barrier film 174 and a contact plug 176, which are sequentially stacked on the metal silicide film 172. The conductive barrier film 174 may surround and contact a bottom surface and sidewalls of the contact plug 176. In embodiments, the conductive barrier film 174 may include a metal or a metal nitride. For example, the conductive barrier film 174 may include titanium (Ti), tantalum (Ta), tungsten (W), titanium nitride (TiN), tantalum nitride (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include a metal selected from molybdenum (Mo), copper (Cu), tungsten (W), cobalt (Co), ruthenium (Ru), manganese (Mn), titanium (Ti), tantalum (Ta), aluminum (Al), and a combination thereof.

The plurality of source/drain contacts CA may pass through the inter-gate dielectric film 144 and the insulating liner 142 and extend long in the vertical direction (Z direction). The conductive barrier film 174 may be between the metal silicide film 172 and the contact plug 176. The conductive barrier film 174 may have a surface in contact with the metal silicide film 172 and a surface in contact with the contact plug 176.

As shown in FIGS. 2A to 2C, a top surface of each of the plurality of source/drain contacts CA and the plurality of capping insulating patterns 168 may be covered by a middle insulating structure 181. The capping insulating pattern 168 may be between the gate line 160 and the middle insulating structure 181. The middle insulating structure 181 may have a top surface, which extends in a lateral direction at a first vertical level LVA on the substrate 102.

The middle insulating structure 181 may include an etch stop film 182 and a middle insulating film 183, which are sequentially stacked on the plurality of source/drain contacts CA and the capping insulating pattern 168. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The middle insulating film 183 may include an oxide film, a nitride film, an ultralow-k (ULK) film having an ultralow dielectric constant K of about 2.2 to about 2.4, or a combination thereof. For example, the middle insulating film 183 may include a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 1, 2A, and 2C, a plurality of first contact structures VA may be on the plurality of source/drain contacts CA. Each of the plurality of first contact structures VA may pass through the middle insulating structure 181 in the vertical direction (Z direction) and be in contact with the source/drain contact CA. Each of the plurality of first contact structures VA may extend by a first vertical length HA from a top surface of the middle insulating structure 181 toward the substrate 102 in the vertical direction (Z direction). Each of the plurality of source/drain regions 130 may be electrically connected to the first contact structure VA through the metal silicide film 172 and the source/drain contact CA. A bottom surface of each of the plurality of first contact structures VA may be in contact with a top surface of the source/drain contact CA. Each of the plurality of first contact structures VA may have a first top surface VAT, which extends planar along an extension line of the top surface of the middle insulating structure 181.

In other embodiments, each of the plurality of first contact structures VA may include a first metal liner 192A and a first metal plug 196A, which are sequentially stacked on the source/drain contact CA. Outer sidewalls of the first metal liner 192A may be in contact with each of the etch stop film 182 and the middle insulating film 183 included in the middle insulating structure 181. The first metal liner 192A may include a single metal. For example, the first metal liner 192A may include tungsten (W). The first metal plug 196A may have a bottom surface and sidewalls surrounded by the first metal liner 192A. The bottom surface and the sidewalls of the first metal plug 196A may be in contact with the first metal liner 192A. The first metal plug 196A may include a single metal. For example, the first metal plug 196A may include tungsten (W). Each of the plurality of first contact structures VA may not include a metal nitride film.

In each of the plurality of first contact structures VA, the first metal liner 192A may cover the sidewalls of the first metal plug 196A to a variable thickness as a distance from the substrate 102 in the vertical direction (Z direction) increases. The first metal liner 192A may continuously extend without being cut off on the sidewalls of the first metal plug 196A in the vertical direction (Z direction). Accordingly, in each of the plurality of first contact structures VA, the first metal plug 196A may be apart from the middle insulating structure 181 with the first metal liner 192A therebetween. In each of the plurality of first contact structures VA, the first metal plug 196A may not include a portion in contact with the middle insulating structure 181.

A thickness of the first metal liner 192A in a lateral direction (e.g., X direction or Y direction) may vary as the distance from the substrate 102 in the vertical direction (Z direction) increases. As shown in FIGS. 2A and 2C, a portion of the first metal liner 192A, which covers a bottom surface of the first metal plug 196A, may have a greater thickness than a portion of the first metal liner 192A, which covers the sidewalls of the first metal plug 196A. The portion of the first metal liner 192A, which covers the sidewalls of the first metal plug 196A, may include a portion of which a thickness is reduced as the distance from the substrate 102 in the vertical direction (Z direction) increases, and a portion of which a thickness increases as the distance from the substrate 102 in the vertical direction (Z direction) increases. As used herein, the first metal liner 192A may be referred to as a metal liner, and the first metal plug 196A may be referred to as a metal plug.

A second contact structure CB may be apart from each of the plurality of first contact structures VA in a lateral direction. The second contact structure CB may pass through the middle insulating structure 181 and the capping insulating pattern 168 in the vertical direction (Z direction) and be connected to the gate line 160. The capping insulating pattern 168 may be between the substrate 102 and the middle insulating structure 181 at a vertical level lower than a vertical level of a bottom surface of each of the plurality of first contact structures VA. A bottom surface of the second contact structure CB may be in contact with the top surface of the gate line 160. The second contact structure CB may extend by a vertical length greater than the first vertical length HA in the vertical direction (Z direction) from the top surface of the middle insulating structure 181 toward the substrate 102.

The second contact structure CB may have a second top surface CBT, which is convex from the top surface of the middle insulating structure 181 in a direction away from the substrate 102. Of the second top surface CBT of the second contact structure CB, an uppermost surface that is farthest from the substrate 102 may be at a second vertical level LVB, which is farther from the substrate 102 than the first vertical level LVA. A second vertical length HB of the second contact structure CB may be greater than the first vertical length HA of each of the plurality of first contact structures VA.

In other embodiments, the second contact structure CB may include a second metal liner 192B, a nucleation metal layer 194, and a second metal plug 196B, which are sequentially stacked on the gate line 160. The second contact structure CB may include a lower portion surrounded by the capping insulating pattern 168 and an upper portion surrounded by the middle insulating structure 181. In the lower portion of the second contact structure CB, outer sidewalls of the second metal liner 192B may be in contact with the capping insulating pattern 168. In the upper portion of the second contact structure CB, the outer sidewalls of the second metal liner 192B may be in contact with each of the etch stop film 182 and the middle insulating film 183 included in the middle insulating structure 181.

The second metal liner 192B may include a single metal. For example, the second metal liner 192B may include the same material as the first metal liner 192A. In other embodiments, the second metal liner 192B may include tungsten (W).

The nucleation metal layer 194 may be between the second metal liner 192B and the second metal plug 196B and include the same material as a constituent material of the second metal liner 192B. The nucleation metal layer 194 may be only in the second contact structure CB, out of the first contact structure VA and the second contact structure CB. In other embodiments, the nucleation metal layer 194 may include tungsten (W). A heterogeneous material MPT including nonmetal or semimetal elements may be irregularly dispersed in at least one region of a surface and the inside of the nucleation metal layer 194. The nonmetal or semimetal elements included in the heterogeneous material MPT may include at least one atom selected from a boron (B) atom, a silicon (Si) atom, and a fluorine (F) atom, without being limited thereto.

The second metal plug 196B may have a bottom surface and sidewalls surrounded by the second metal liner 192B. The second metal plug 196B may be apart from the second metal liner 192B with the nucleation metal layer 194 therebetween. The second metal plug 196B may include the same material as a constituent material of the first metal plug 196A included in each of the plurality of first contact structures VA. The second metal plug 196B may include a single metal. In other embodiments, the second metal plug 196B may include tungsten (W). The second contact structure CB may not include a metal nitride film.

In other embodiments, the second metal liner 192B may continuously extend without being cut off on outer sidewalls of the nucleation metal layer 194 in the vertical direction (Z direction). Accordingly, in the second contact structure CB, the nucleation metal layer 194 may be apart from the middle insulating structure 181 and the capping insulating pattern 168 with the second metal liner 192B therebetween. In the second contact structure CB, the nucleation metal layer 194 may not include a portion in contact with the middle insulating structure 181 and a portion in contact with the capping insulating pattern 168.

In the second contact structure CB, a thickness of the second metal liner 192B in a lateral direction (e.g., X direction or Y direction) may vary as a distance from the substrate 102 in the vertical direction (Z direction) increases. The second metal liner 192B may cover the sidewalls of the second metal plug 196B to a variable thickness with the nucleation metal layer 194 therebetween.

As shown in FIGS. 2A to 2D, a portion of the second metal liner 192B, which covers a bottom surface of the second metal plug 196B, may have a greater thickness than a portion of the second metal liner 192B, which covers the sidewalls of the second metal plug 196B. A portion of the second metal liner 192B, which covers the sidewalls of the second metal plug 196B, may include a portion of which a thickness is reduced (e.g., a portion of which a thickness is reduced from a thickness W1 to a thickness W2 in FIG. 2D) as a distance from the substrate 102 in the vertical direction (Z direction) increases, and a portion of which a thickness increases (e.g., a portion of which a thickness increase from the thickness W2 to a thickness W3 in FIG. 2D) as the distance from the substrate 102 in the vertical direction (Z direction) increases. As used herein, the second metal liner 192B may be referred to as a metal liner, and the second metal plug 196B may be referred to as a metal plug.

In the second contact structure CB, a thickness of the nucleation metal layer 194 in a lateral direction may be substantially constant as a distance from the substrate 102 in the vertical direction (Z direction) increases. In the second contact structure CB having a relatively high aspect ratio (or a ratio of a vertical length to a horizontal width), the nucleation metal layer 194 may supplement the step coverage of the second metal liner 192B, which degrades due to a portion having a relatively small thickness, of the second metal liner 192B. In addition, the nucleation metal layer 194 may improve the gap-fill characteristics of the second metal plug 196B formed on the nucleation metal layer 194.

In the second contact structure CB, the nucleation metal layer 194 may include a softer material than the second metal liner 192B and the second metal plug 196B due to the fact that the second metal liner 192B, the nucleation metal layer 194, and the second metal plug 196B are the resultant structures obtained by using different deposition processes from each other.

For example, the second metal liner 192B may be formed by performing a physical vapor deposition (PVD) using a tungsten target, and each of the nucleation metal layer 194 and the second metal plug 196B may be formed by performing a chemical vapor deposition (CVD) process using a tungsten-containing gas and a reducing agent. However, the nucleation metal layer 194 may be formed by using, as the reducing agent, a plurality of types of reducing agents including hydrogen ($H_2$) and at least one selected from a boron-containing reducing agent and a silicon-containing reducing agent, and the second metal plug 196B may be formed by using a single type of reducing agent including only hydrogen ($H_2$) as the reducing agent. Herein, the tungsten-containing gas may include tungsten hexafluoride ($WF_6$), the boron-containing reducing agent may include diborane ($B_2H_6$), and the silicon-containing reducing agent may include silane ($SiH_4$), without being limited thereto.

As shown in FIG. 2E, in the second top surface CBT of the second contact structure CB, the nucleation metal layer 194 may have a partially cut planar shape in a cut region 194C. Accordingly, in the second top surface CBT of the second contact structure CB, the nucleation metal layer 194 may have a planar shape discontinuously surrounding the second metal plug 196B. The second top surface CBT of the second contact structure CB may include a portion where the second metal liner 192B is apart from the second metal plug 196B with the nucleation metal layer 194 therebetween and a portion where the second metal liner 192B is in contact with the second metal plug 196B.

An aspect ratio of the second contact structure CB may be higher than an aspect ratio of each of the plurality of first contact structures VA. In other embodiments, an aspect ratio of each of the plurality of first contact structures VA may be selected in a range of about 3.5 to about 10, for example, about 4 to about 6, and an aspect ratio of each of the plurality of first contact structures VA may be selected in a range of about 1 to about 5, for example, about 2 to about 3.5, without being limited thereto.

As described above, each of the plurality of first contact structures VA and the second contact structure CB may not include a conductive barrier film including a metal nitride, such as TiN and TaN. Accordingly, each of the plurality of first contact structures VA and the second contact structure CB may have a relatively low electrical resistance compared to the case of including the conductive barrier film including the metal nitride. For example, each of the plurality of first contact structures VA and the second contact structure CB may have an electrical resistance reduced by at least 60%, compared to the case of including the conductive barrier film including the metal nitride. Accordingly, electrical properties of each of the plurality of first contact structures VA and the second contact structure CB may be improved.

In other embodiments, an electrical resistance of the second contact structure CB may be higher than an electrical resistance of each of the plurality of first contact structures VA due to the heterogeneous material MPT including non-metal or semimetal elements that are irregularly dispersed on a surface of and/or inside the nucleation metal layer 194 included in the second contact structure CB. The heterogeneous material MPT that is irregularly dispersed on the surface of and/or inside the nucleation metal layer 194 may be reaction residue that is derived from a tungsten-containing gas (e.g., $WF_6$) and a reducing agent (e.g., $B_2H_6$, $SiH_4$, or a combination thereof), which are used during a process of forming the nucleation metal layer 194. A content of the heterogeneous material MPT that is irregularly dispersed on the surface and/or inside the nucleation metal layer 194 may be within an acceptable range that does not adversely affect the electrical properties of the second contact structure CB. Accordingly, the degradation of the IC device 100 due to the heterogeneous material MPT included in the second contact structure CB may not be caused.

As shown in FIGS. 2A to 2C, an upper insulating structure 185 may be on each of the plurality of first contact structures VA, the second contact structure CB, and the middle insulating structure 181. The upper insulating structure 185 may include an etch stop film 186 and an upper insulating film 187, which are sequentially stacked on the middle insulating structure 181. Details of the etch stop film 186 and the upper insulating film 187 may be substantially similar to those of the etch stop film 182 and the middle insulating film 183, which are in the middle insulating structure 181.

A bottom surface of the upper insulating structure 185 may include a planar local bottom surface in contact with the top surface of the middle insulating structure 181 and a concave local bottom surface, which faces the second top surface CBT of the second contact structure CB and is concave toward the second top surface CBT. As used herein, of the bottom surface of the upper insulating structure 185, the planar local bottom surface in contact the top surface of the middle insulating structure 181 may be referred to as a first local bottom surface, and the concave local bottom surface facing the second top surface CBT of the second contact structure CB may be referred to as a second local bottom surface.

As in a portion indicated by a dashed line CBX in FIGS. 2A to 2C, the etch stop film 186 included in the upper insulating structure 185 may include a portion covering the second top surface CBT of the second contact structure CB. The portion of the etch stop film 186, which covers the second top surface CBT of the second contact structure CB, may include a convex local top surface 186T corresponding to a convex profile of the second top surface CBT.

As shown in FIG. 2A, the upper wiring layer M1 may pass through the upper insulating structure 185 and be connected to the first contact structure VA. Although one upper wiring layer M1 is illustrated in the present embodiment, the IC device 100 may include a plurality of upper wiring layers M1, which pass through the upper insulating structure 185. Each of the plurality of upper wiring layers M1 may be connected to a selected one of the plurality of first contact structures VA and the second contact structure CB. The upper wiring layer M1 may include Mo, Co, Cu, W, Ru, Mn, Ti, Ta, Al, a combination thereof, or an alloy thereof, without being limited thereto.

Figure 3:
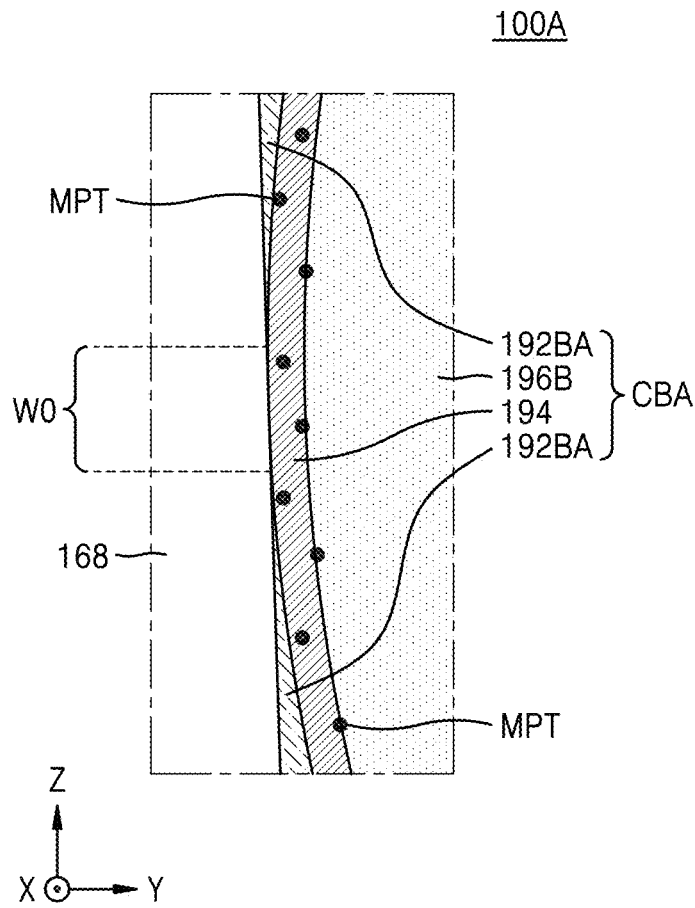
FIG. 3 is a cross-sectional view of an IC device according to embodiments.

FIG. 3 is a cross-sectional view of an IC device 100A according to embodiments. FIG. 3 illustrates an enlarged cross-sectional configuration of a portion corresponding to portion "EX2" of FIG. 2B. In FIG. 3, the same reference numerals are used to denote the same elements as in FIGS. 1 to 2E, and detailed descriptions thereof are omitted.

Referring to FIG. 3, the IC device 100A may substantially have the same configuration as the IC device 100 described with reference to FIGS. 1 and 2E. However, the IC device 100A may include a second contact structure CBA instead of the second contact structure CB.

The second contact structure CBA of the IC device 100A may substantially have the same configuration as the second contact structure CB described with reference to FIGS. 1 and 2E. However, the second contact structure CBA may include a second metal liner 192BA, which discontinuously extends in a vertical direction (Z direction) instead of the second metal liner 192B. The second contact structure CBA may include a cut region W0 in which a portion of the second metal liner 192BA is cut off in a lower local region of the second contact structure CBA that is in contact with the capping insulating pattern 168, of an outer sidewall of the second contact structure CBA. Because the second metal liner 192BA is partially cut off in the cut region W0, the second metal liner 192BA may have a shape discontinuously extending in the vertical direction (Z direction). The second metal liner 192BA may include portions of which a thickness increases in a direction away from the cut region W0. The nucleation metal layer 194 may be in contact with the capping insulating pattern 168 in the lower local region of the second contact structure CBA, which includes the cut region W0.

In the second contact structure CBA of the IC device 100A, a thickness of the nucleation metal layer 194 in a lateral direction may be substantially constant in the vertical direction (Z direction). In the second contact structure CBA having a relatively high aspect ratio, although the second metal liner 192BA has degraded step coverage due to the partially cut portion in the cut region W0 and a portion having a relatively small thickness, the nucleation metal layer 194 may supplement the degraded step coverage of the second metal liner 192BA. In addition, the nucleation metal layer 194 may improve the gap-fill characteristics of the second metal plug 196B formed on the nucleation metal layer 194.

Figure 4:
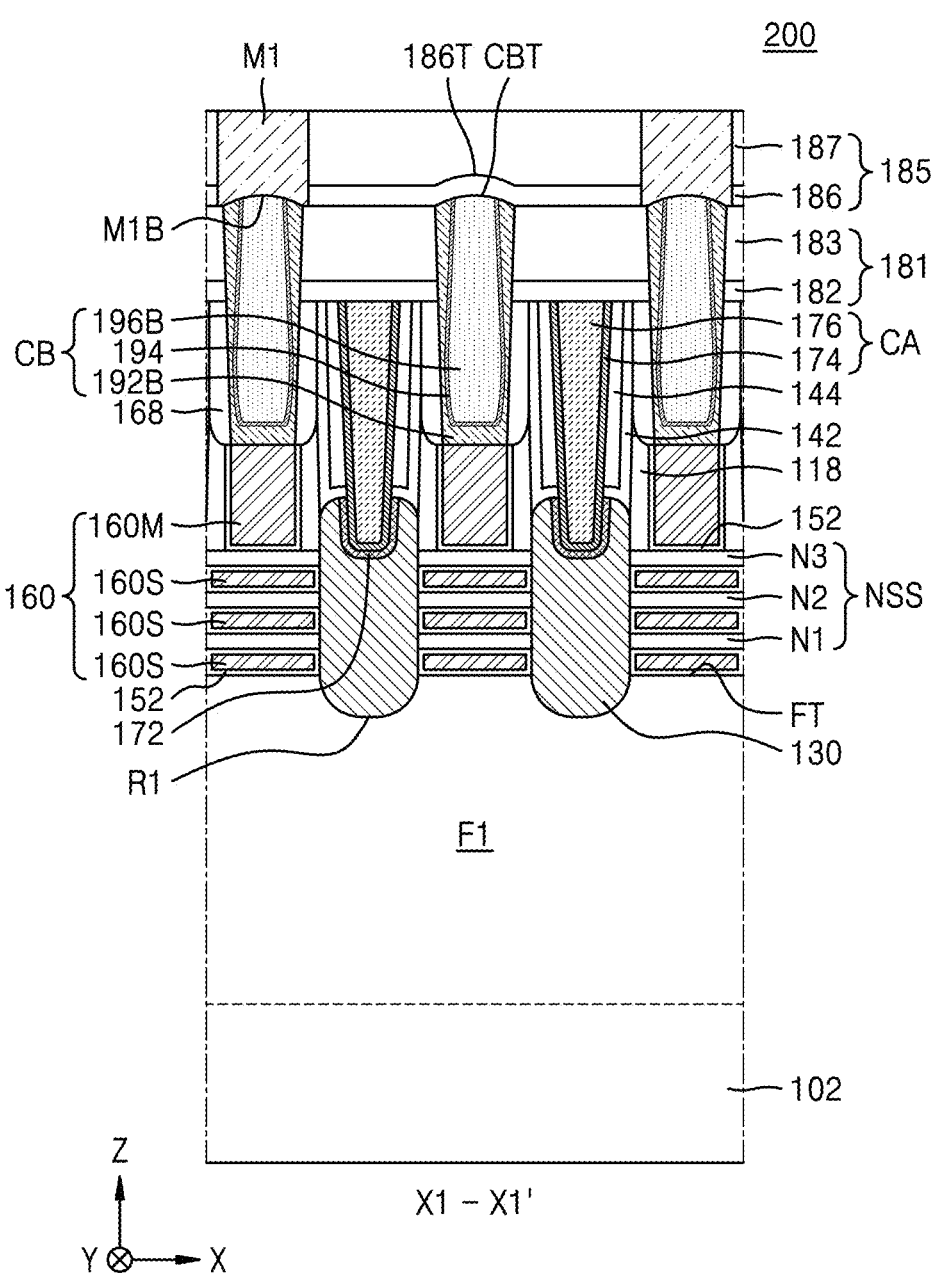
FIG. 4 is a cross-sectional view of an IC device according to embodiments.

FIG. 4 is a cross-sectional view of an IC device 200 according to embodiments. FIG. 4 illustrates a cross-sectional configuration of a portion corresponding to a cross-section taken along line X1-X1' of FIG. 1 in the IC device 200. In FIG. 4, the same reference numerals are used to denote the same elements as in FIGS. 1 to 2E, and detailed descriptions thereof are omitted.

Referring to FIG. 4, the IC device 200 may substantially have the same configuration as the IC device 100 described with reference to FIGS. 1 and 2E. However, the IC device 200 may include a plurality of second contact structures CB, each of which is connected to a gate line 160, and a plurality of upper wiring layers M1 that pass through an upper insulating structure 185.

The plurality of upper wiring layers M1 may include an upper wiring layer M1 in contact with a second top surface CBT of the second contact structure CB. The upper wiring layer M1, which is in contact with the second top surface CBT of the second contact structure CB, may include a local bottom surface M1B, which is concave toward the second top surface CBT of the second contact structure CB. Details of each of the plurality of upper wiring layers M1 may be the same as those of the upper wiring layer M1, which have been described with reference to FIG. 2A.

Figure 5:
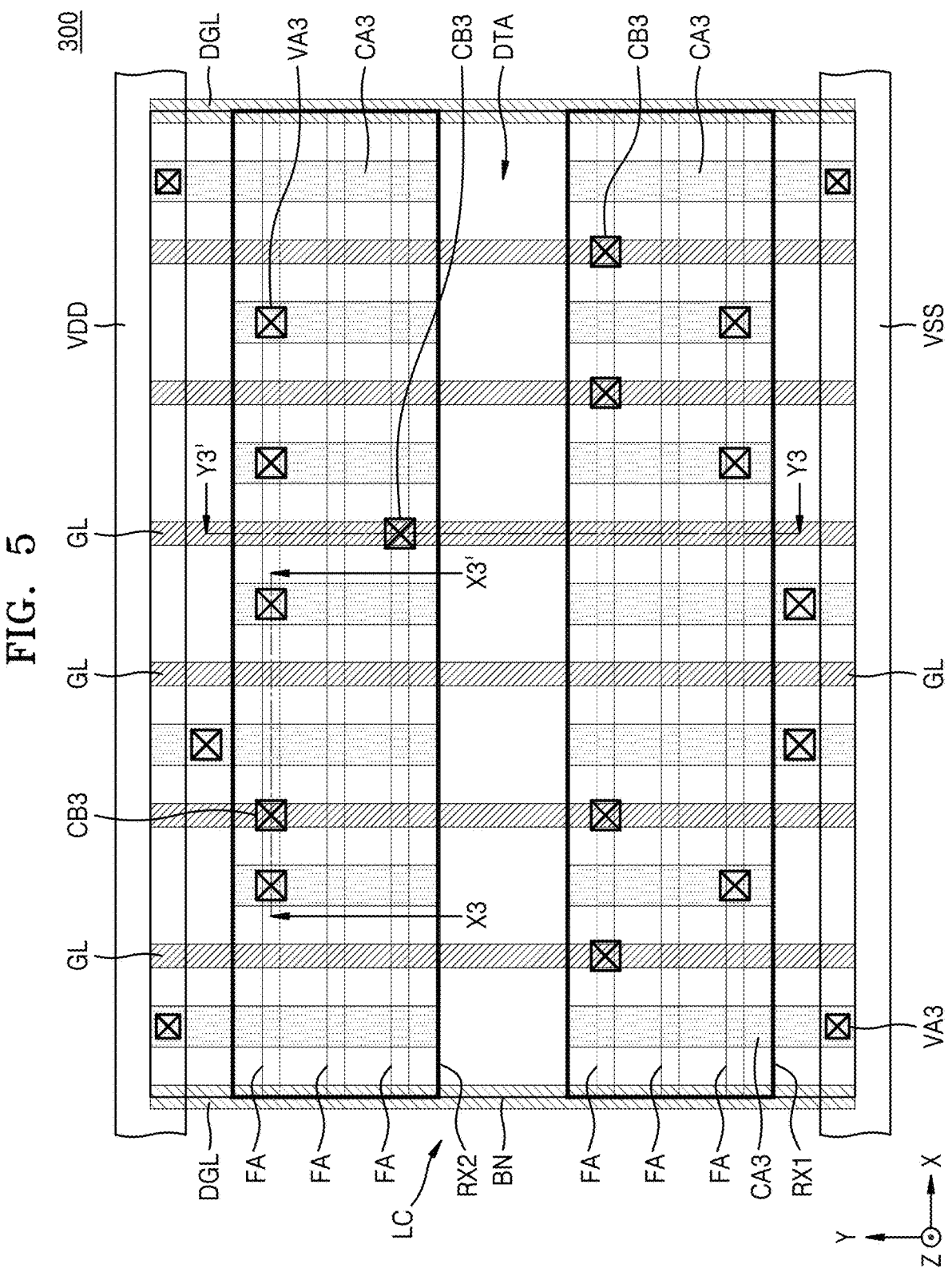
FIG. 5 is a plan layout diagram of an IC device according to embodiments.
Figure 6A:
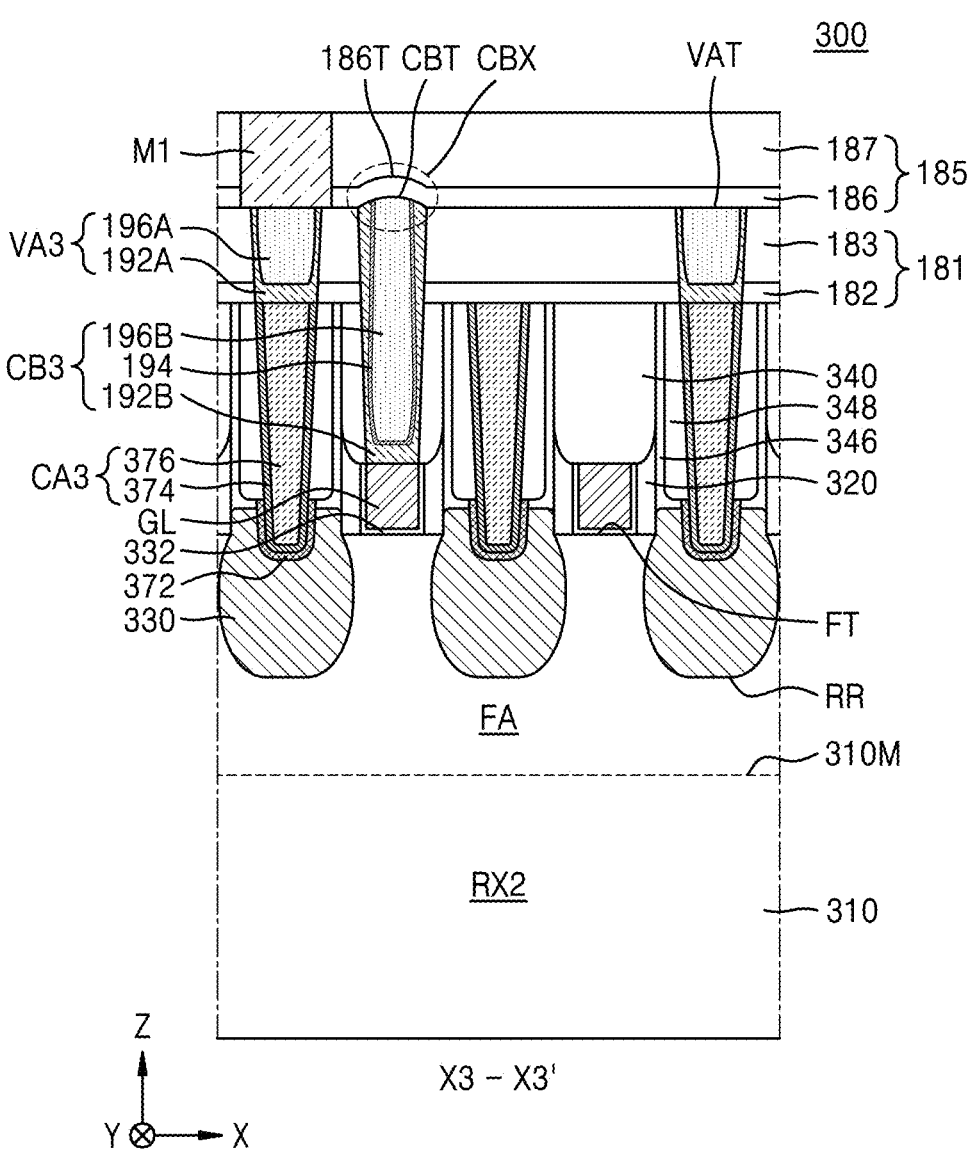
FIG. 6A is a cross-sectional view of some components corresponding to a cross-section taken along line X3-X3' of FIG. 5.
Figure 6B:
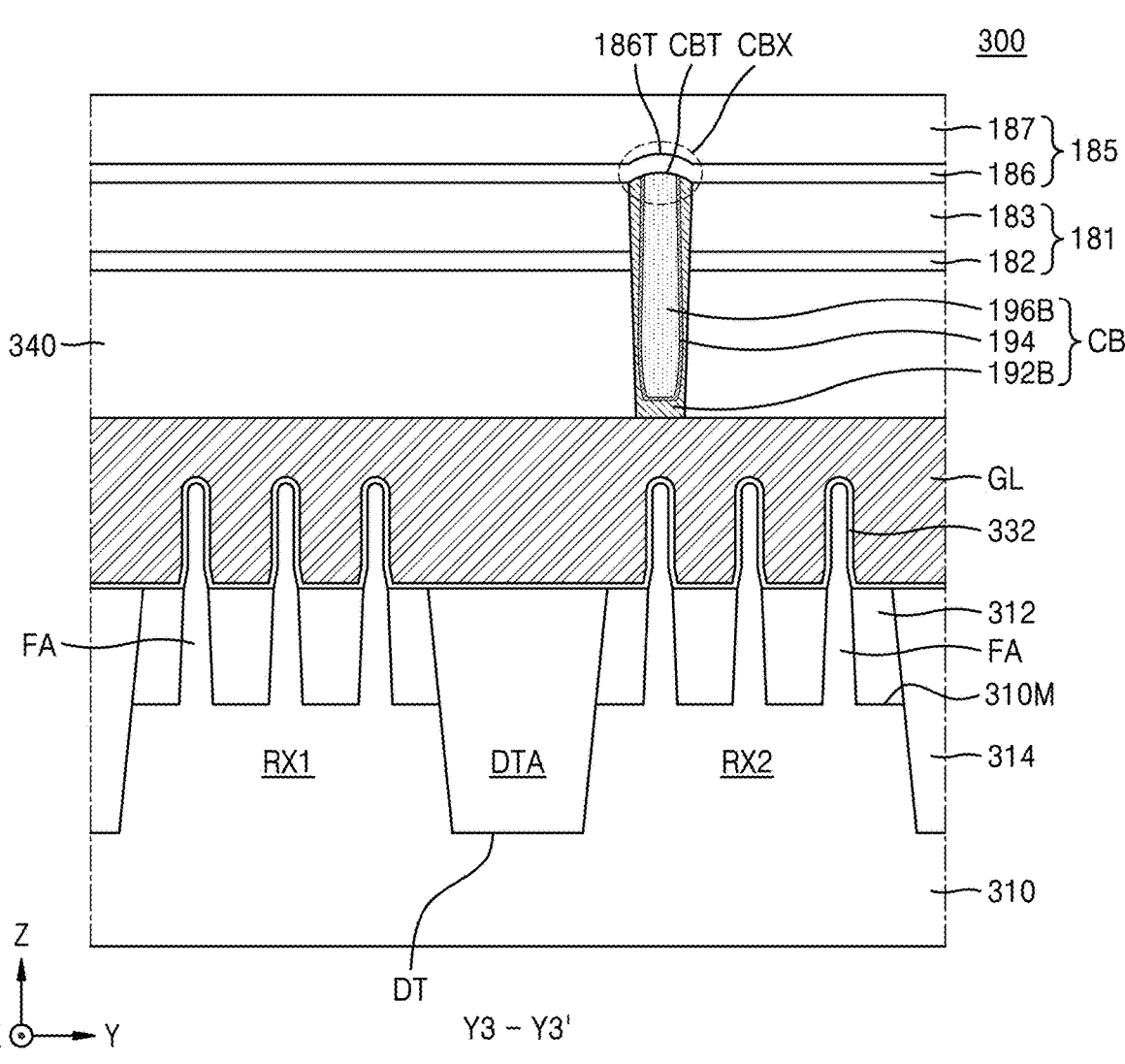
FIG. 6B is a cross-sectional view of some components corresponding to a cross-section taken along line Y3-Y3' of FIG. 5.

FIG. 5 is a plan layout diagram of an IC device 300 according to embodiments. FIG. 6A is a cross-sectional view of some components corresponding to a cross-section taken along line X3-X3' of FIG. 5. FIG. 6B is a cross-sectional view of some components corresponding to a cross-section taken along line Y3-Y3' of FIG. 5.

Referring to FIGS. 5, 6A, and 6B, the IC device 300 may include a logic cell including a fin field effect (FinFET) transistor device. The IC device 300 may include a logic cell LC, which is formed in a region defined by a cell boundary BN on a substrate 310.

The substrate 310 may have a main surface 310M, which extends in a lateral direction (on an X-Y plane). The substrate 310 may substantially have the same configuration as the substrate 102 described with reference to FIGS. 2A and 2B.

The logic cell LC may include a first device region RX1 and a second device region RX2. A plurality of fin-type active regions FA, which protrude from the substrate 310, may be in each of the first device region RX1 and the second device region RX2. The plurality of fin-type active regions FA may extend parallel to each other in a widthwise direction of the logic cell LC, that is, a first lateral direction (X direction).

As shown in FIG. 6B, a device isolation film 312 may be on the substrate 210 in the first device region RX1 and the second device region RX2. The device isolation film 312 may be between every two adjacent ones of the plurality of fin-type active regions FA and cover lower sidewalls of the fin-type active region FA. In the first device region RX1 and the second device region RX2, each of the plurality of fin-type active regions FA may protrude as a fin type over the device isolation film 312. An inter-device isolation region DTA may be between the first device region RX1 and the second device region RX2. A deep trench DT defining the first device region RX1 and the second device region RX2 may be formed in the inter-device isolation region DTA. The deep trench DT may be filled by an inter-device isolation insulating film 314. Each of the device isolation film 312 and the inter-device isolation insulating film 314 may include an oxide film.

A plurality of gate dielectric films 332 and a plurality of gate lines GL may extend on the substrate 310 in a height direction of the local cell LC (e.g., a second lateral direction (Y direction)), which intersects with the plurality of fin-type active regions FA. The plurality of gate dielectric films 332 and the plurality of gate lines GL may cover a top surface and both sidewalls of each of the plurality of fin-type active regions FA, a top surface of the device isolation film 312, and a top surface of the inter-device isolation insulating film 314.

A plurality of MOS transistors may be formed along the plurality of gate lines GL in the first device region RX1 and the second device region RX2. Each of the plurality of MOS transistors may be a MOS transistor having a three-dimensional (3D) structure in which a channel is formed on the top surface and both the sidewalls of each of the plurality of fin-type active regions FA. In other embodiments, the first device region RX1 may be an NMOS transistor region, and a plurality of NMOS transistors may be formed in portions where the fin-type active regions FA intersect with the gate lines GL in the first device region RX1. The second device region RX2 may be a PMOS transistor region, and a plurality of PMOS transistors may be formed in portions where the fin-type active regions FA intersect with the gate lines GL in the second device region RX2.

A plurality of dummy gate lines DGL may extend along portions of the cell boundary BN, which extend in the second lateral direction (Y direction). The plurality of dummy gate lines DGL may include the same material as the plurality of gate lines GL. The plurality of dummy gate lines DGL may remain electrically floated during the operation of the IC device 100 and function as an electrical isolation region between the logic cell LC and another local cell adjacent thereto. The plurality of gate lines GL and the plurality of dummy gate lines DGL may have the same width and be arranged at a constant pitch in the first lateral direction (X direction)

The plurality of gate dielectric films 332 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. An interface film (not shown) may be between the fin-type active region FA and the gate dielectric film 332. The interface film may include an oxide film, a nitride film, or an oxynitride film.

A constituent material of each of the plurality of gate lines GL and the plurality of dummy gate lines DGL may substantially be the same as that of the gate line 160, which has been described with reference to FIGS. 1 and 2C.

A plurality of insulating spacers 320 may cover both sidewalls of the plurality of gate lines GL and the plurality of dummy gate lines DGL. The plurality of gate lines GL, the plurality of dummy gate lines DGL, the plurality of gate dielectric films 332, and the plurality of insulating spacers 320 may be covered by a capping insulating pattern 340. Each of the capping insulating pattern 340 and the plurality of insulating spacers 320 may extend as a line type in the second lateral direction (Y direction).

Each of the plurality of insulating spacers 320 may include silicon nitride (SiN), SiCN, SiBN, SiON, SiOCN, SiBCN, or a combination thereof, without being limited thereto. The plurality of capping insulating patterns 340 may include silicon nitride (SiN).

A plurality of recess regions RR may be formed in the top surfaces of the plurality of fin-type active regions FA, respectively. A plurality of source/drain regions 330 may be inside the plurality of recess regions RR. The gate line GL may be apart from the source/drain region 330 with the gate dielectric film 332 and the insulating spacer 320 therebetween.

The plurality of source/drain regions 330 may include an epitaxial semiconductor layer, which are epitaxially grown from the plurality of recess regions RR. For example, the plurality of source/drain regions 330 may include an epitaxially grown Si layer, an epitaxially grown SiC layer, or a plurality of epitaxially grown SiGe layers. When the first device region RX1 is an NMOS transistor region and the second device region RX2 is a PMOS transistor region, the plurality of source/drain regions 330 in the first device region RX1 may include a Si layer doped with an n-type dopant or a SiC layer doped with an n-type dopant, and the plurality of source/drain regions 330 in the second device region RX2 may include a SiGe layer doped with a p-type dopant. The n-type dopant may be selected from phosphorus (P), arsenic (As), and antimony (Sb). The p-type dopant may be selected from boron (B) and gallium (Ga).

In other embodiments, the plurality of source/drain regions 330 in the first device region RX1 may have different shapes and sizes from the plurality of source/drain regions 330 in the second device region RX2. A shape of each of the plurality of source/drain regions 330 is not limited to that illustrated in FIG. 6A, and a plurality of source/drain regions 330 having various other shapes and sizes may be formed in the first device region RX1 and the second device region RX2.

A plurality of metal silicide films 372 may be respectively on the plurality of source/drain regions 330. The metal silicide film 372 may have the same configuration as the metal silicide film 172 described with reference to FIG. 2A.

An insulating liner 346 and an inter-gate dielectric film 348 may be sequentially arranged on the plurality of source/drain regions 330 and the plurality of metal silicide films 372. The insulating liner 346 and the inter-gate dielectric film 348 may constitute a lower insulating structure. In other embodiments, the insulating liner 346 may include silicon nitride (SiN), SiCN, SiBN, SiON, SiOCN, SiBCN, or a combination thereof, without being limited thereto. The inter-gate dielectric film 348 may include a silicon oxide film, without being limited thereto.

Each of a plurality of source/drain contacts CA3 may pass through the inter-gate dielectric film 348 and the insulating liner 346 in the vertical direction (Z direction) and be connected to the source/drain region 330 through the metal silicide film 372. Each of the plurality of source/drain contacts CA3 may be apart from the gate line GL in the first lateral direction (X direction) with the insulating spacer 320 therebetween. Each of the plurality of source/drain regions 330 may be connected to the first contact structure VA3 through the metal silicide film 372 and the source/drain contact CA3.

Each of the plurality of source/drain contacts CA3 may include a conductive barrier film 374 and a contact plug 376, which are sequentially stacked on the metal silicide film 372. The conductive barrier film 374 may surround and contact a bottom surface and sidewalls of the contact plug 376. Details of the plurality of source/drain contacts CA3 and the conductive barrier film 374 and the contact plug 376, which are in each of the plurality of source/drain contacts CA3, may substantially be the same as those of the plurality of source/drain contacts CA and the conductive barrier film 174 and the contact plug 176 that are in each of the plurality of source/drain contacts CA, which have been described with reference to FIGS. 1 and 2C.

A top surface of each of the plurality of source/drain contacts CA3 and a top surface of each of a plurality of capping insulating patterns 340 may be covered by a middle insulating structure 181. The capping insulating pattern 340 may be between the gate line GL and the middle insulating structure 181. The middle insulating structure 181 may include an etch stop film 182 and a middle insulating film 183, which are sequentially stacked on the plurality of source/drain contacts CA3 and the capping insulating pattern 340.

As shown in FIG. 6A, a plurality of first contact structures VA3 may be on the plurality of source/drain contacts CA3. Each of the plurality of first contact structures VA3 may pass through the middle insulating structure 181 in the vertical direction (Z direction) and be in contact with the source/drain contact CA3. Each of the plurality of first contact structures VA3 may have a first top surface VAT, which extends planar along an extension line of a top surface of the middle insulating structure 181. Details of the plurality of first contact structures VA3 may be the same as those of the plurality of first contact structures VA, which have been described with reference to FIGS. 1 and 2A to 2C.

A second contact structure CB3 may be apart from each of the plurality of first contact structures VA3 in a lateral direction. The second contact structure CB3 may pass through the middle insulating structure 181 and the capping insulating pattern 340 in the vertical direction (Z direction) and be connected to the gate line GL. A bottom surface of the second contact structure CB3 may be in contact with a top surface of the gate line GL. The second contact structure CB3 may have a second top surface CBT, which is convex from the top surface of the middle insulating structure 181 in a direction away from the substrate 310. Details of a plurality of second contact structures CB3 may be the same as those of the second contact structure CB described with reference to FIGS. 1 and 2A to 2E.

Each of the plurality of first contact structures VA3 and the plurality of second contact structures CB3 may not include a conductive barrier film including a metal nitride, such as TiN and TaN. Accordingly, each of the plurality of first contact structures VA3 and the second contact structure CB3 may have a relatively low electrical resistance compared to the case of including the conductive barrier film including the metal nitride. Therefore, electrical properties of each of the plurality of first contact structures VA and the second contact structure CB may be improved.

An upper insulating structure 185 may be on each of the plurality of first contact structures VA3, the plurality of second contact structures CB3, and the middle insulating structure 181. The upper insulating structure 185 may include an etch stop film 186 and an upper insulating film 187, which are sequentially stacked on the middle insulating structure 181. A bottom surface of the upper insulating structure 185 may include a planar local bottom surface in contact with the top surface of the middle insulating structure 181 and a concave local bottom surface, which faces the second top surface CBT of the second contact structure CB3 and is concave toward the second top surface CBT.

As in a portion indicated by a dashed line CBX in FIGS. 6A and 6B, the etch stop film 186 included in the upper insulating structure 185 may include a portion covering the second top surface CBT of the second contact structure CB3. The portion of the etch stop film 186, which covers the second top surface CBT of the second contact structure CB3, may include a convex local top surface 186T corresponding to a convex profile of the second top surface CBT.

As shown in FIG. 6A, an upper wiring layer M1 may pass through the upper insulating structure 185 and be connected to the first contact structure VA3. Although not shown, the IC device 300 may further include a plurality of upper wiring layers M1, which pass through the upper insulating structure 185, and each of the plurality of upper wiring layers M1 may be connected to a selected one of the first contact structure VA3 and the plurality of second contact structures CB3. From among the plurality of upper wiring layers M1, the upper wiring layer M1 connected to the second contact structure CB3 may include a local bottom surface, which is concave toward the second top surface CBT of the second contact surface CB3, similar to that described with reference to FIG. 4.

As shown in FIG. 5, in the logic cell LC, a ground line VSS may be connected to the fin-type active region FA in the first device region RX1 through the source/drain contact CA3 located in the first device region RX1, from among the plurality of source/drain contacts CA3. A power line VDD may be connected to the fin-type active region FA in the second device region RX2 through the source/drain contact CA3 located in the second device region RX2, from among the plurality of source/drain contacts CA3. The ground line VSS and the power line VDD may be formed at a higher level than the top surface of each of the plurality of source/drain contacts CA3 and the plurality of second contact structures CB3.

FIGS. 7A to 17 are cross-sectional views of a process sequence of a method of manufacturing an IC device, according to embodiments. More specifically, FIGS. 7A, 8A, 9A, and 10 to 17 are cross-sectional views of an example sectional structure of a portion corresponding to the cross-section taken along line X1-X1' of FIG. 1, according to a process sequence. FIGS. 7B, 8B, and 9B are cross-sectional views of an example sectional structure of a portion corresponding to a cross-section taken along line Y1-Y1' of FIG. 1, according to a process sequence. An example method of manufacturing the IC device 100 illustrated in FIGS. 1 and 2A to 2E is described with reference to FIGS. 7A to 17. In FIGS. 7A to 17, the same reference numerals are used to denote the same elements as in FIGS. 1 and 2A to 2E, and detailed descriptions thereof are omitted.

Figure 7A:
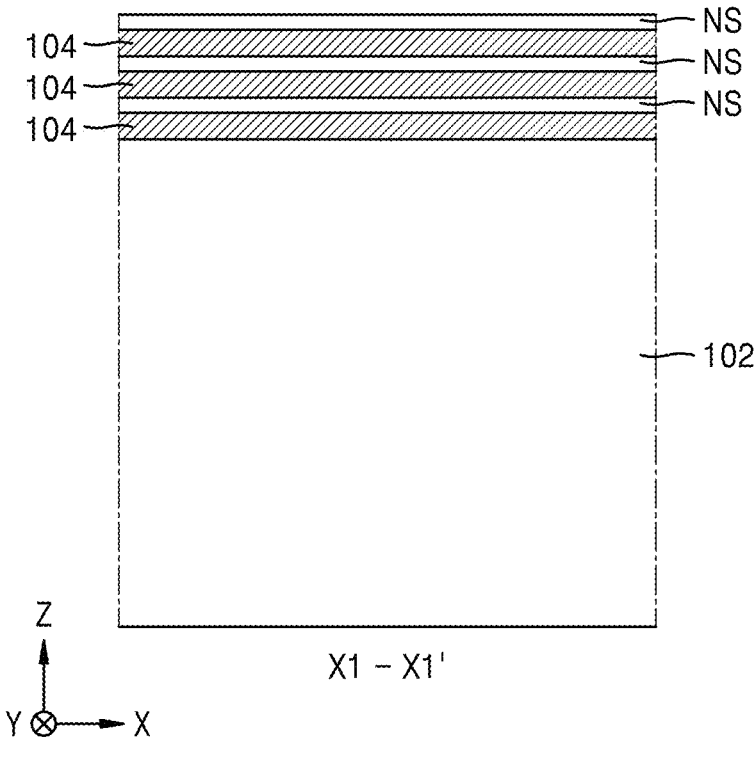
Figure 7B:
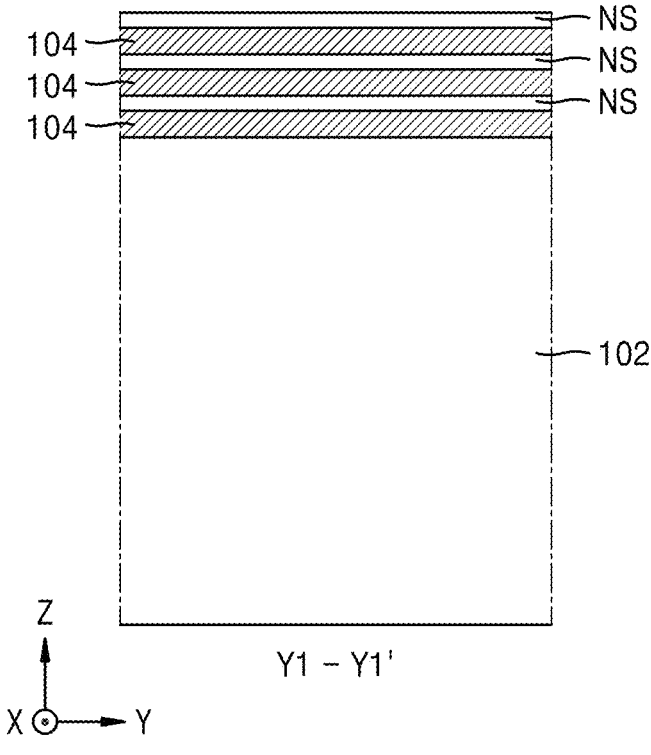
FIGS. 7B, 8B, and 9B are cross-sectional views of an example sectional structure of a portion corresponding to a cross-section taken along line Y1-Y1' of FIG. 1, according to a process sequence.

Referring to FIGS. 7A and 7B, a plurality of sacrificial semiconductor layers 104 and a plurality of nanosheet semiconductor layers NS may be alternately stacked one by one on a substrate 102.

The plurality of sacrificial semiconductor layers 104 and the plurality of nanosheet semiconductor layers NS may include semiconductor materials having different etch selectivities from each other. In other embodiments, the plurality of nanosheet semiconductor layers NS may include a Si layer, and the plurality of sacrificial semiconductor layers 104 may include a SiGe layer. In other embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge content of the SiGe layer included in the plurality of sacrificial semiconductor layers 104 may be variously selected as needed.

Figure 8A:
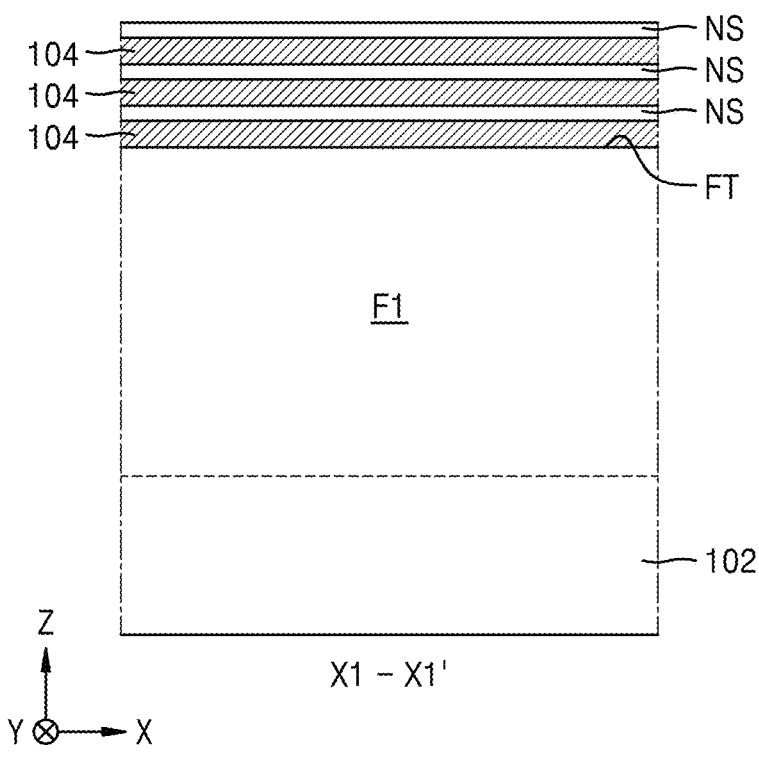
Figure 8B:
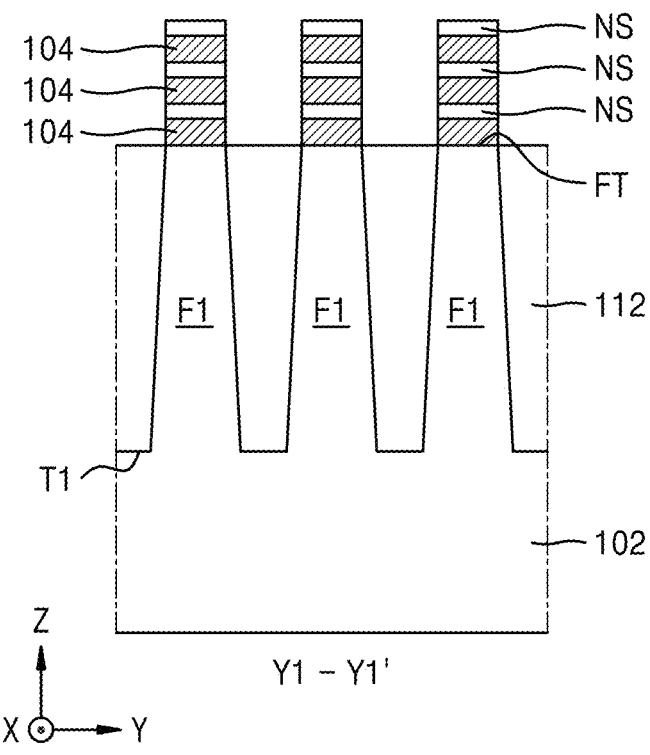

Referring to FIGS. 8A and 8B, the plurality of sacrificial semiconductor layers 104, the plurality of nanosheet semiconductor layers NS, and the substrate 102 may be partially etched, and thus, a plurality of fin-type active regions F1 may be defined in the substrate 102. Thereafter, a device isolation film 112 may be formed to cover sidewalls of each of the plurality of fin-type active regions F1. A stack structure of the plurality of sacrificial semiconductor layers 104 and the plurality of nanosheet semiconductor layers NS may remain on a fin top surface FT of each of the plurality of fin-type active regions F1.

Figure 9A:
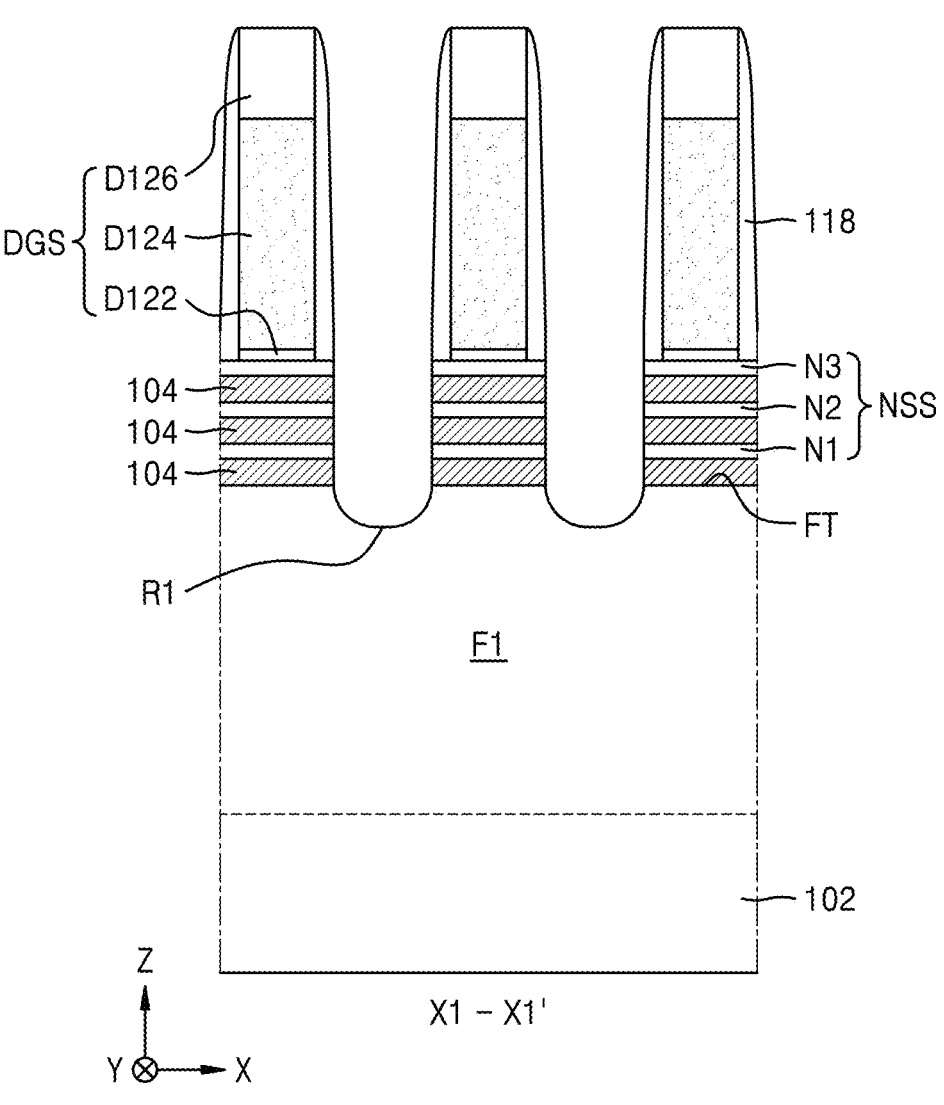
Figure 9B:
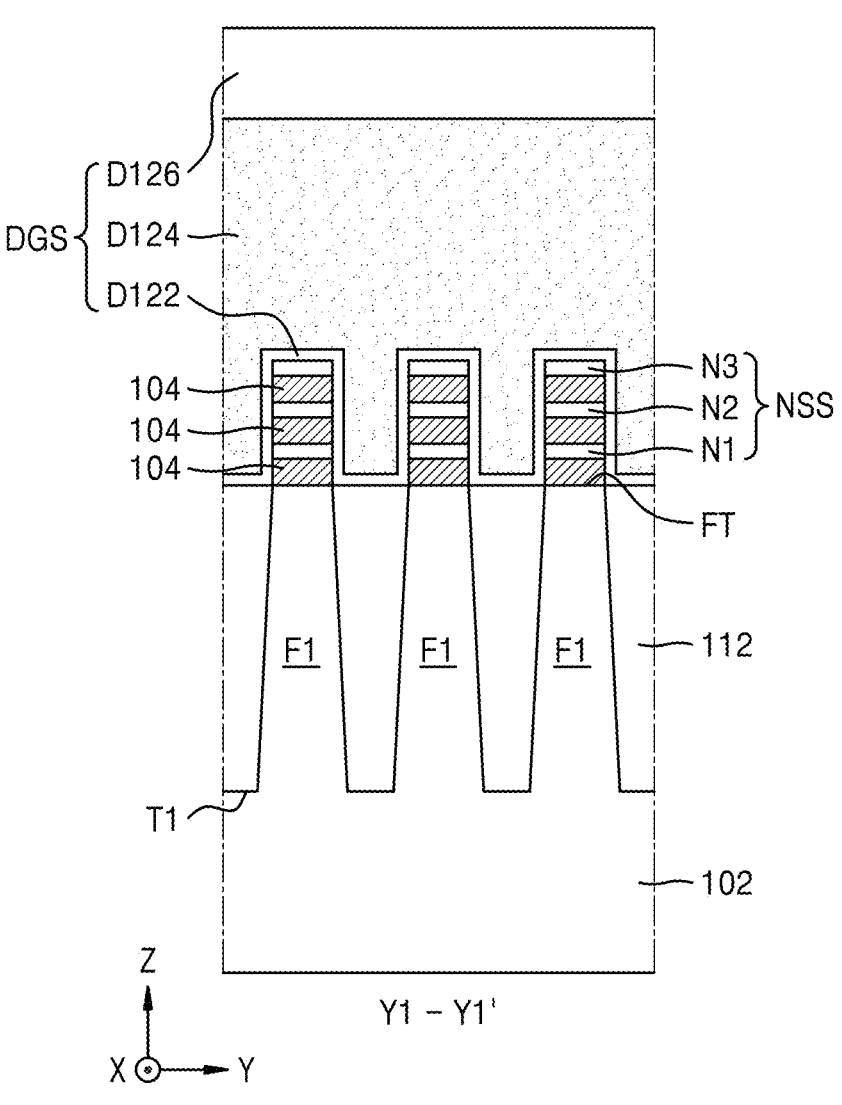

Referring to FIGS. 9A and 9B, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend long in the second lateral direction (Y direction). Each of the plurality of dummy gate structures DGS) may have a structure in which an oxide film D122, a dummy gate layer D124, and a capping layer D126 are sequentially stacked. In other embodiments, the dummy gate layer D124 may include polysilicon, and the capping layer D126 may include a silicon nitride film.

After a plurality of insulating spacers 118 are formed to cover both sidewalls of each of the plurality of dummy gate structures DGS, a portion of each of the plurality of sacrificial semiconductor layers 104 and the plurality of nanosheet semiconductor layers NS and a portion of the fin-type active region F1 may be etched by using the plurality of dummy gate structures DGS and the plurality of insulating spacers 118 as an etch mask. Thus, the plurality of nanosheet semiconductor layers NS may be divided into a plurality of nanosheet stacks NSS, and a plurality of recesses R1 may be formed in an upper portion of the fin-type active region F1. Each of the plurality of nanosheet stacks NSS may include a first nanosheet N1, a second nanosheet N2, and a third nanosheet N3. The plurality of recesses R1 may be etched by using a dry etching process, a wet etching process, or a combination thereof.

Figure 10:
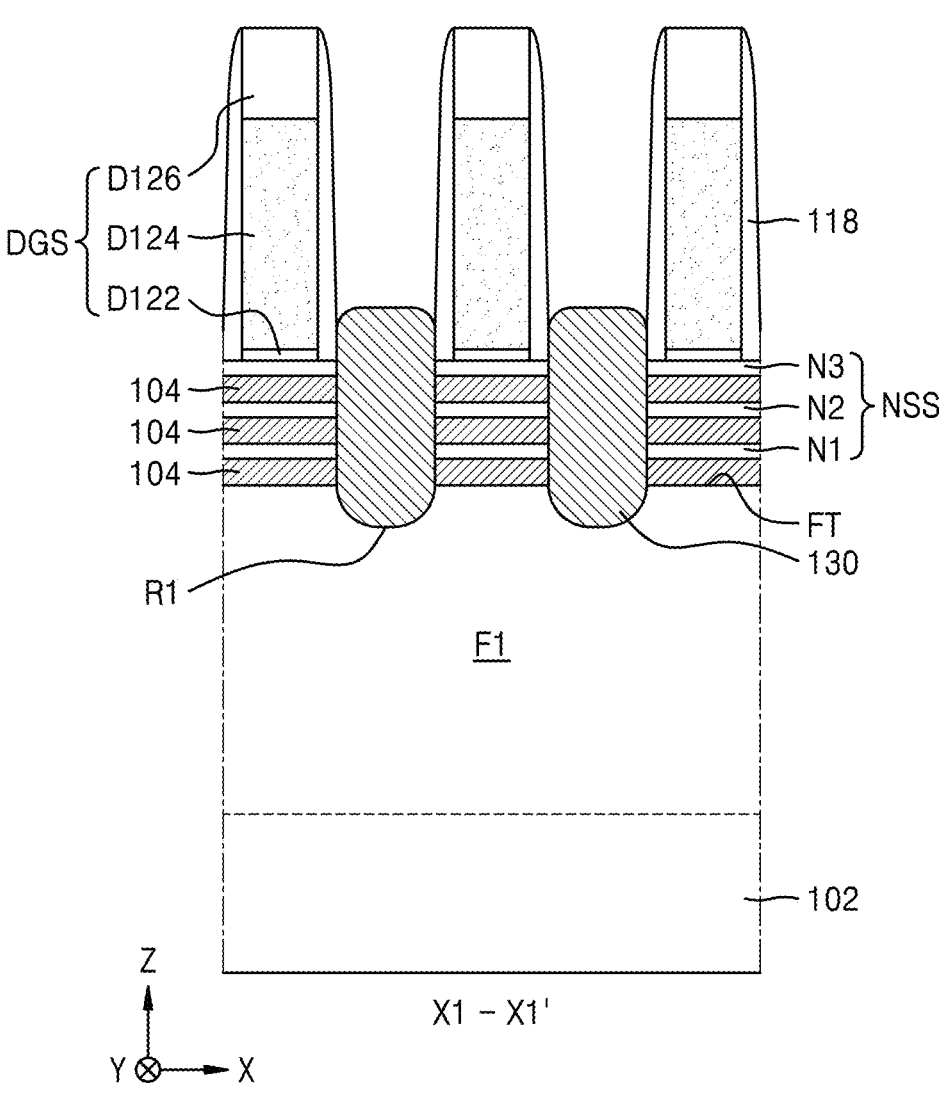

Referring to FIG. 10, in the resultant structure of FIGS. 9A and 9B, a plurality of source/drain regions 130 may be formed to fill the plurality of recesses R1.

To form the plurality of source/drain regions 130, a semiconductor material may be epitaxially from a surface of the fin-type active region F1, which is exposed at bottom surfaces of the plurality of recesses R1, and sidewalls of each of the first to third nanosheets N1, N2, and N3 included in the nanosheet stack NSS.

Figure 11:
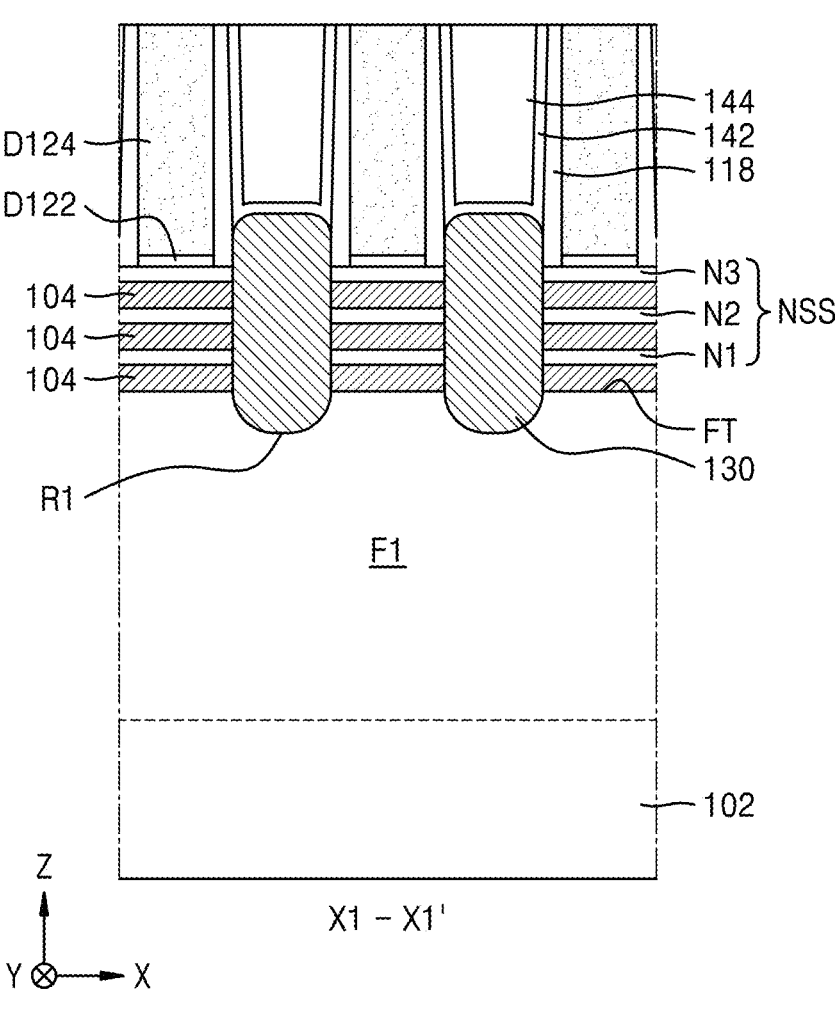

Referring to FIG. 11, an insulating liner 142 may be formed to cover the resultant structure of FIG. 10, and an inter-gate dielectric film 144 may be formed on the insulating liner 142. The insulating liner 142 and the inter-gate dielectric film 144 may be planarized to expose a top surface of the capping layer D126. Thereafter, the capping layer D126 may be removed to expose a top surface of the dummy gate layer D124. The insulating liner 142 and the inter-gate dielectric film 144 may be partially removed such that a top surface of the inter-gate dielectric film 144 becomes at substantially the same level as the top surface of the dummy gate layer D124.

Figure 12:
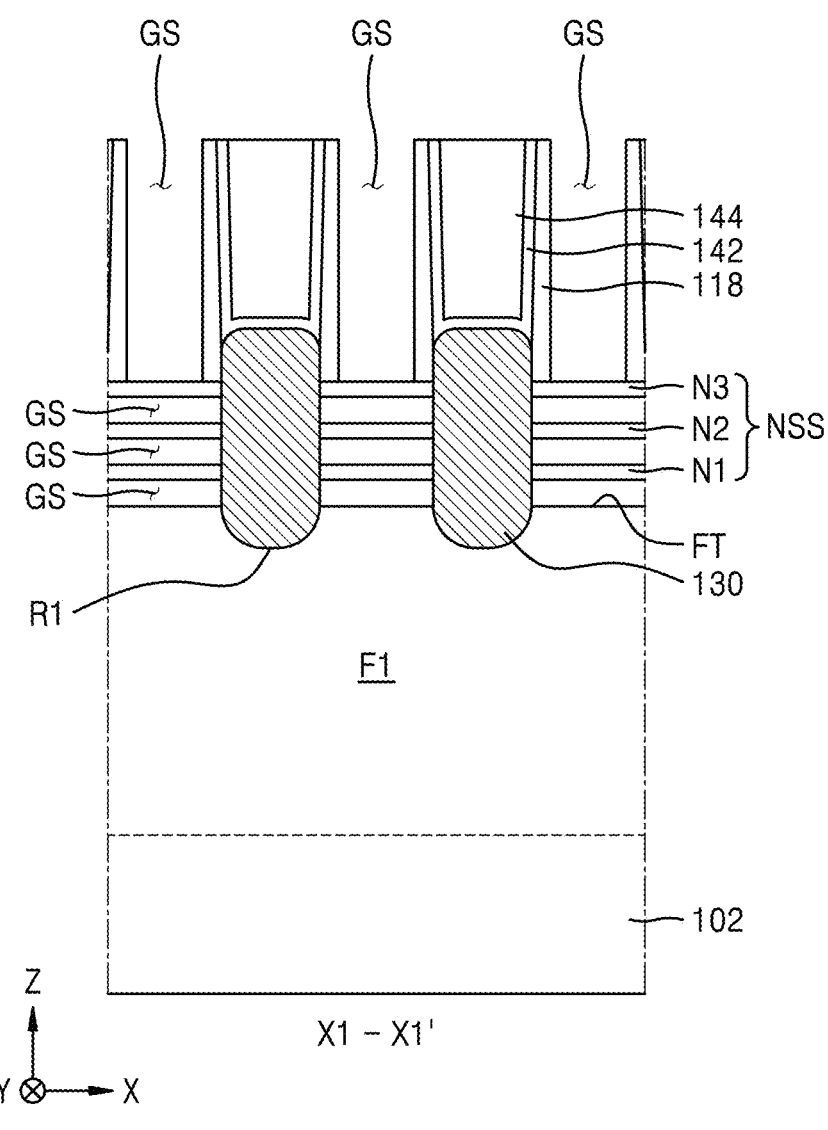

Referring to FIG. 12, the dummy gate layer D124 and the oxide film D122 located thereunder may be removed from the resultant structure of FIG. 11 to prepare a gate space GS, and the plurality of nanosheet stacks NSS may be exposed through the gate space GS. Afterwards, the plurality of sacrificial semiconductor layers 104 remaining on the fin-type active region F1 may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region F1. In other embodiments, to selectively remove the plurality of sacrificial semiconductor layers 104, differences in etch selectivity between the first to third nanosheets N1, N2, and N3 and the plurality of sacrificial semiconductor layers 104 may be used.

A liquid or gaseous etchant may be used to selectively remove the plurality of sacrificial semiconductor layers 104. In other embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 13:
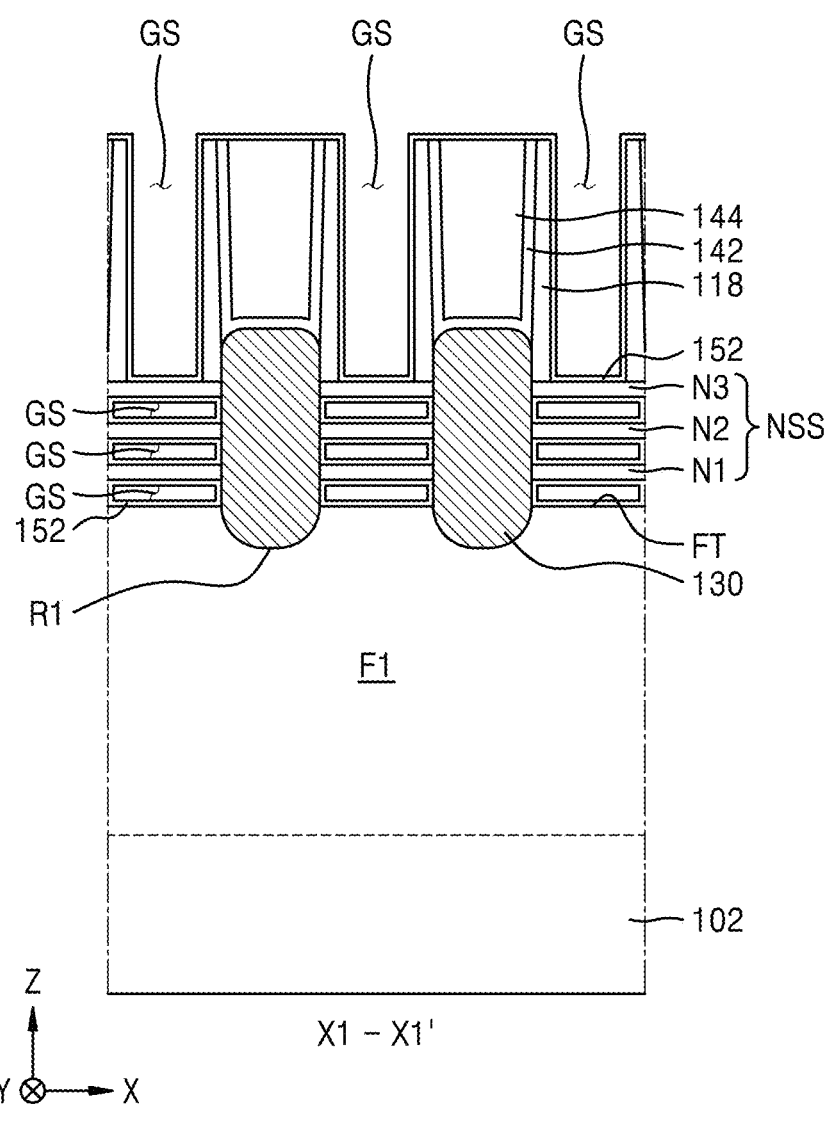

Referring to FIG. 13, in the resultant structure of FIG. 12, a gate dielectric film 152 may be formed to cover respective exposed surfaces of the first to third nanosheets N1, N2, and N3 and the fin-type active region F1. The gate dielectric film 152 may be formed by using an atomic layer deposition (ALD) process.

Figure 14:
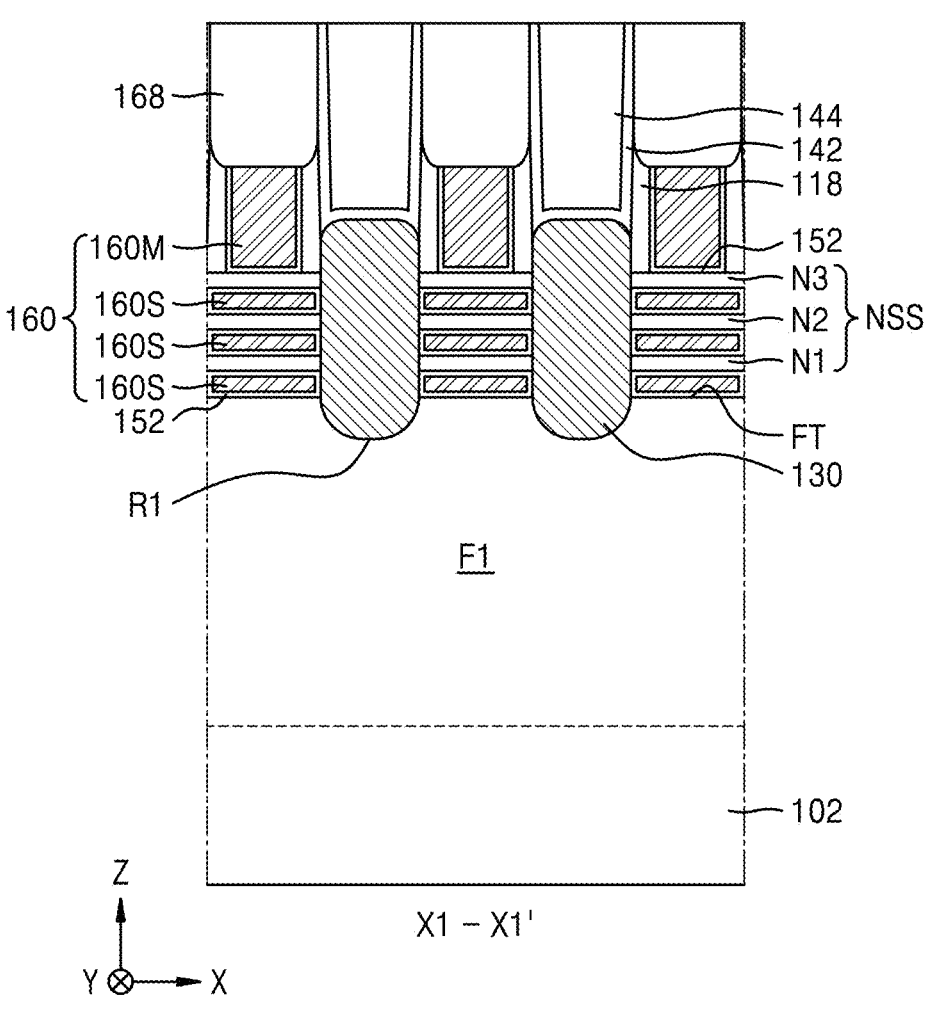

Referring to FIG. 14, a gate line 160 may be formed to fill a gate space (refer to GS in FIG. 13) on the gate dielectric film 152 and cover a top surface of the inter-gate dielectric film 144, and a capping insulating pattern 168 may be formed to cover a top surface of each of the gate line 160 and the gate dielectric film 152 in the gate space GS.

Figure 15:
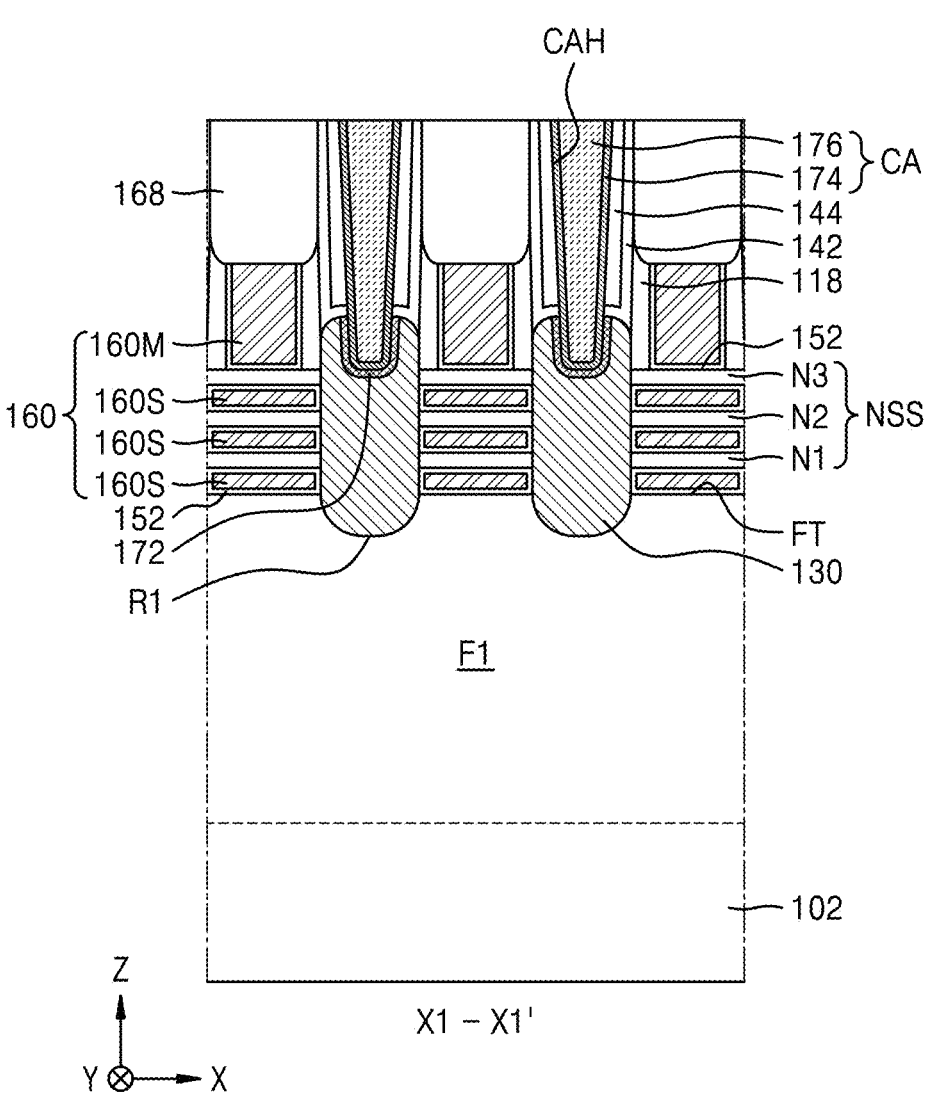

Referring to FIG. 15, in the resultant structure of FIG. 14, a source/drain contact hole CAH exposing the source/drain region 130 may be formed to pass through an insulating structure including the insulating liner 142 and the inter-gate dielectric film 144. A partial region of the source/drain region 130 may be removed by using an anisotropic etching process through the source/drain contact hole CAH, and thus, the source/drain contact hole CAH may extend further toward the substrate 102. In other embodiments, the anisotropic etching process for forming the source/drain contact hole CAH may be performed by using plasma.

After the source/drain contact hole CAH is formed, a metal silicide film 172 may be formed on the source/drain region 130, which is exposed on a bottom side of the source/drain contact hole CAH. In other embodiments, the formation of the metal silicide film 172 may include forming a metal liner (not shown) to conformally cover an inner wall of the source/drain contact hole CAH and performing an annealing process to induce a reaction of the source/drain region 130 with a metal included in the metal liner. After the metal silicide film 172 is formed, the remaining portion of the metal liner may be removed. During the process of forming the metal silicide film 172, a portion of the source/drain region 130 may be consumed. In other embodiments, when the metal silicide film 172 includes a titanium silicide film, the metal liner may include a titanium (Ti) film. Thereafter, a source/drain contact CA including a conductive barrier film 174 and a contact plug 176 may be formed inside each of a plurality of source/drain contact holes CAH.

Figure 16:
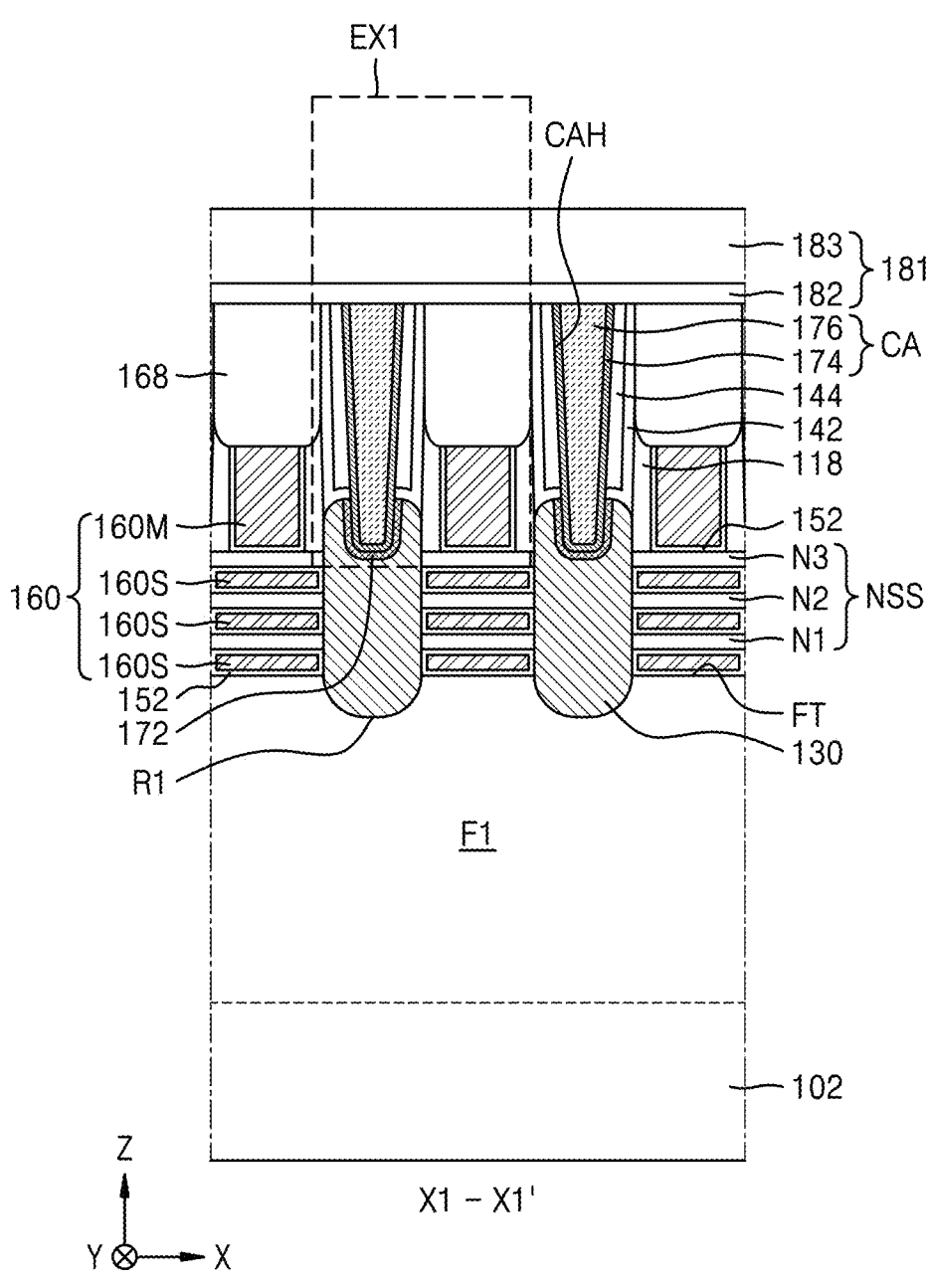

Referring to FIG. 16, in the resultant structure of FIG. 15, an etch stop film 182 and a middle insulating film 183 may be sequentially formed to cover a top surface of each of the source/drain contact CA and the plurality of capping insulating patterns 168, and thus, a middle insulating structure 181 may be formed.

Figure 17:
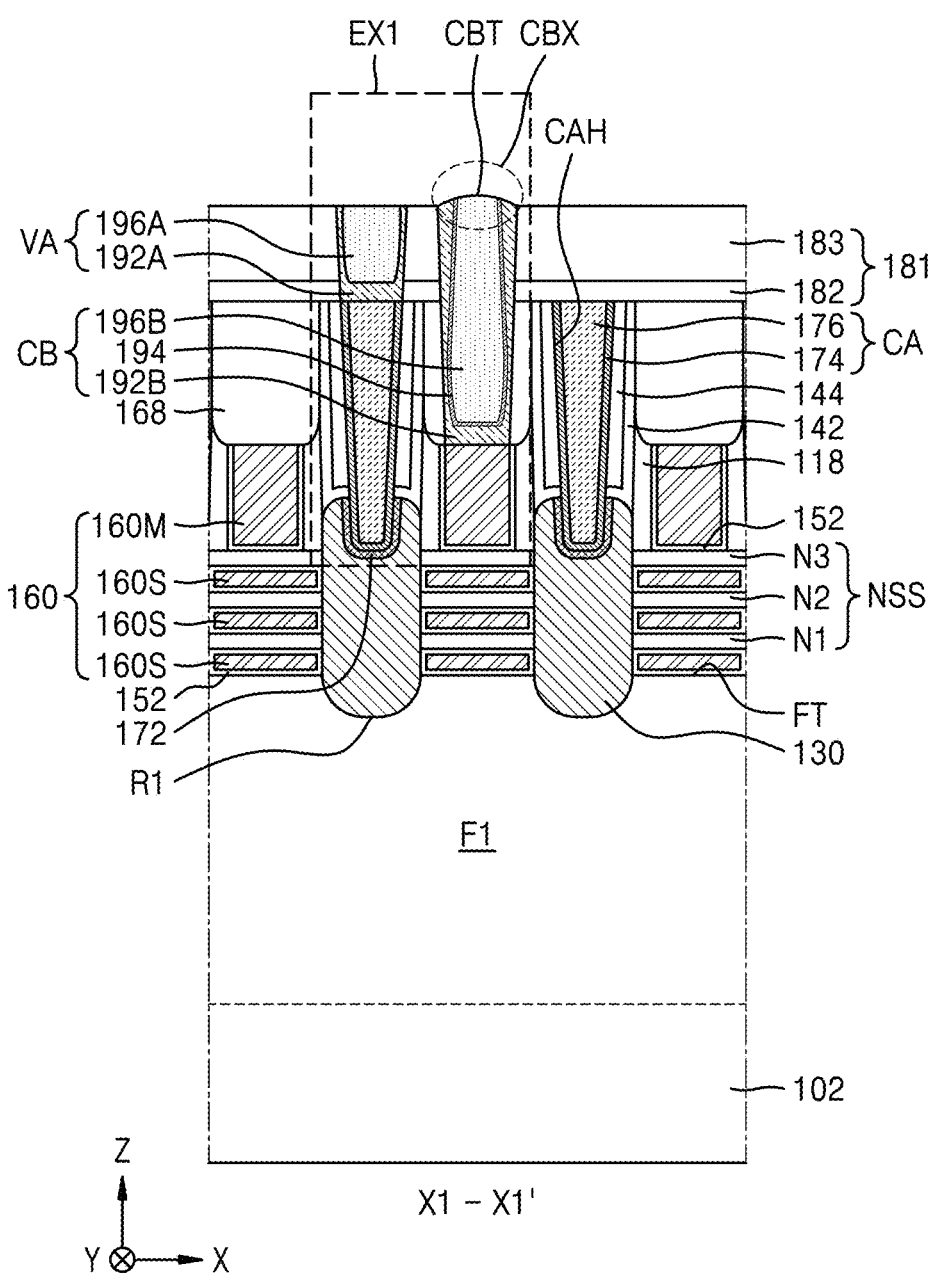

Referring to FIG. 17, in the resultant structure of FIG. 16, a first contact structure VA, which is connected to the source/drain contact CA, and a second contact structure CB, which is connected to the gate line 160, may be formed.

FIGS. 18A to 18K are cross-sectional views of an example process of forming the first contact structure VA and the second contact structure CB, which are shown in FIG. 17, according to a process sequence. FIGS. 18A to 18K illustrate an enlarged cross-sectional configuration of a portion corresponding to portion "EX1" of FIGS. 16 and 17.

Figure 18A:
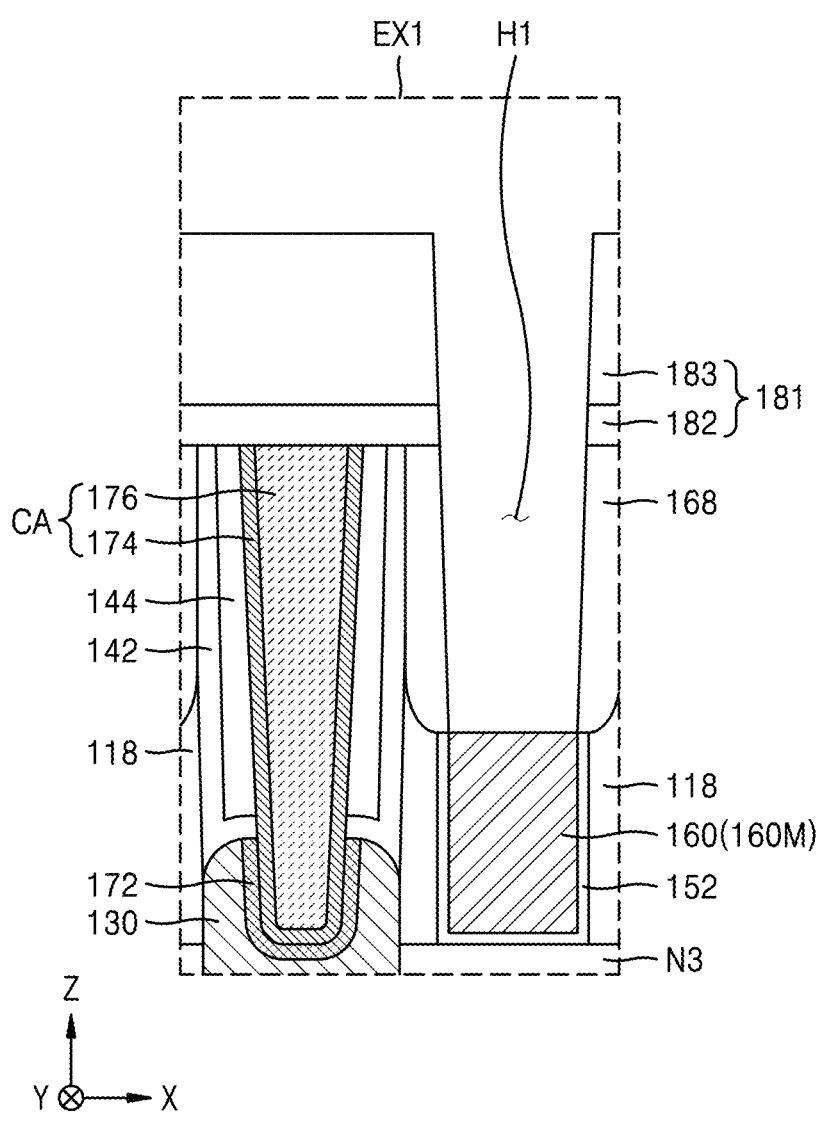
FIGS. 18A to 18K are cross-sectional views of a method of manufacturing an IC device, according to embodiments, which illustrate an example process of forming a first contact structure and a second contact structure included in the IC device, according to a process sequence.

Referring to FIG. 18A, in the resultant structure of FIG. 16, a mask pattern (not shown) may be formed on a middle insulating structure 181, and the middle insulating structure 181 may be etched by using the mask pattern as an etch mask. Thereafter, the capping insulating pattern 168 may be etched to form a gate contact hole H1 exposing a top surface of a gate line 160. Thereafter, the mask pattern may be removed.

Figure 18B:
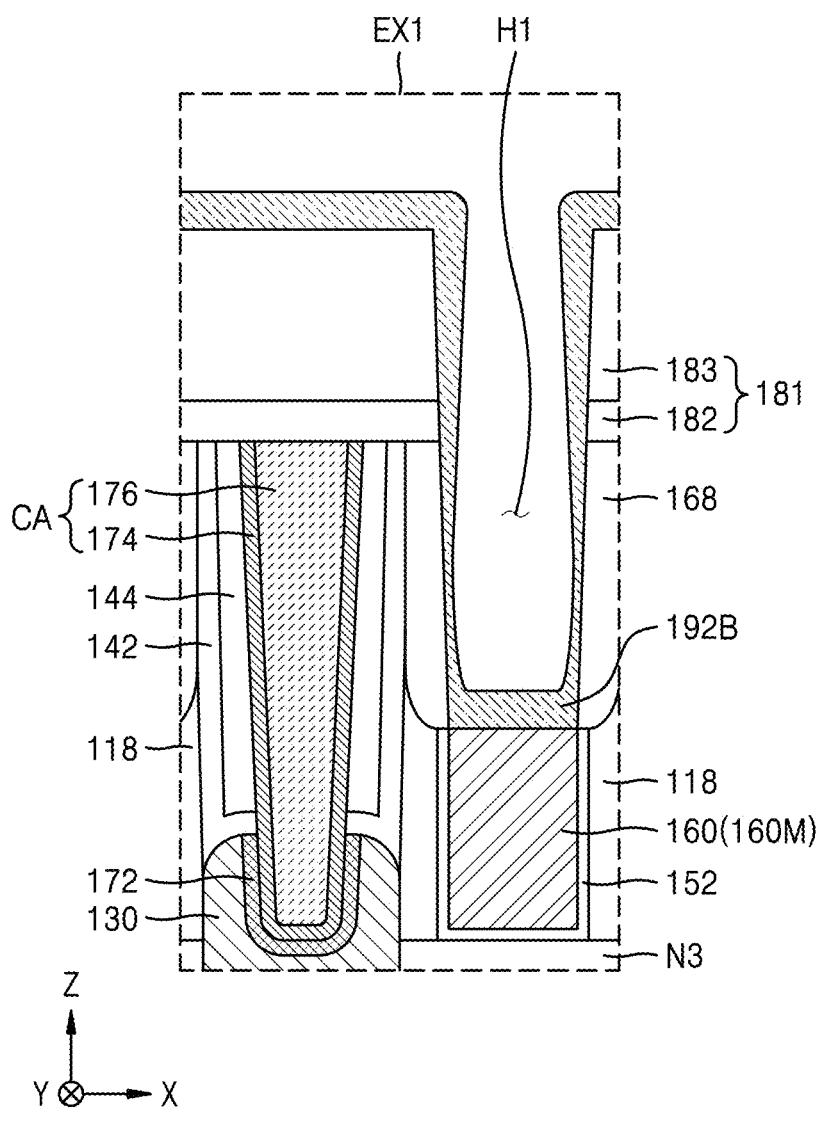

Referring to FIG. 18B, in the resultant structure of FIG. 18A, a second metal liner 192B may be formed to cover an inner surface of the gate contact hole H1 and cover a top surface of the middle insulating structure 181.

In other embodiments, the second metal liner 192B may be formed by performing a PVD process using a tungsten target. As a result, the second metal liner 192B including tungsten (W) may be obtained.

The gate contact hole H1 may pass through the middle insulating structure 181 and the capping insulating pattern 168 in a vertical direction (Z direction) and have a relatively high aspect ratio. Accordingly, while the second metal liner 192B is being formed by using the PVD process, a deposited amount of tungsten may be relatively small on a surface of each of the middle insulating structure 181 and the capping insulating pattern 168, which are exposed on inner sidewalls of the gate contact hole H1, and a deposited amount of tungsten may be relatively large on the top surface of the gate line 160, which is exposed on a bottom surface of the gate contact hole H1. As a result, the second metal liner 192B may be formed to a relatively small thickness on the surface of each of the middle insulating structure 181 inside the gate contact hole H1, and may have a variable thickness in the vertical direction (Z direction). In particular, a portion of the second metal liner 192B, which is formed on the surface of the capping insulating pattern 168 at a position relatively far from an entrance of the gate contact hole H1 (e.g. at a position adjacent to the bottom of the gate contact hole H1), may have a smaller thickness than the thereof or have a discontinuous portion, which does not remain continuous but is locally cut off. The second metal liner 192B, which is formed on the surface of each of the middle insulating structure 181 and the capping insulating pattern 168 inside the gate contact hole H1, may include a portion of which a thickness is reduced from the bottom of the gate contact hole H1 toward the entrance of the gate contact hole H1 and a portion of which a thickness increases toward the entrance of the gate contact hole H1.

Figure 18C:
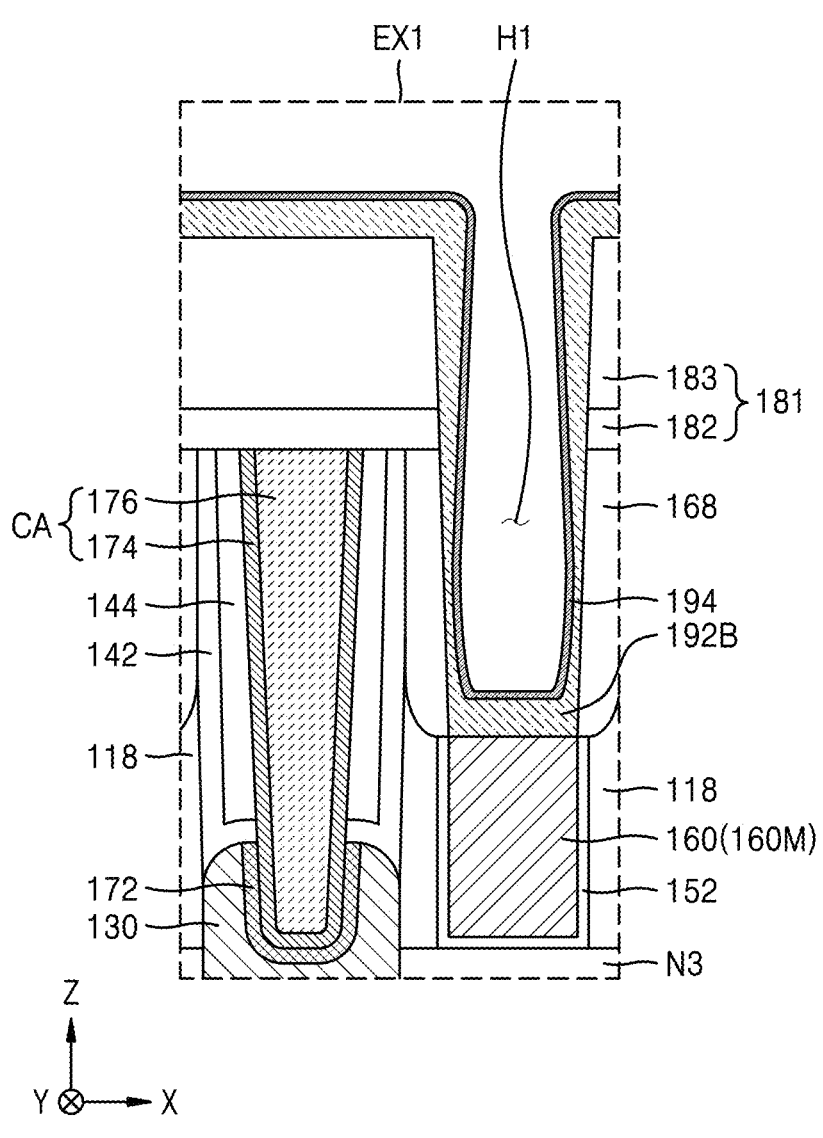

Referring to FIG. 18C, a nucleation metal layer 194 may be formed to conformally cover a surface of the second metal liner 192B, which is exposed in the resultant structure of FIG. 18B. In other embodiments, the nucleation metal layer 194 may include tungsten (W).

The nucleation metal layer 194 may cover the second metal liner 192B to a substantially uniform thickness inside the gate contact hole H1. In the gate contact hole H1 having a relatively high aspect ratio, although the second metal liner 192B may have degraded step coverage due to a portion having a relatively small thickness, the nucleation metal layer 194 may supplement the degraded step coverage of the second metal liner 192B. In addition, the nucleation metal layer 194 may improve the gap-fill characteristics of the second metal plug 196B formed on the nucleation metal layer 194 in a subsequent process of forming a second metal plug 196B as will be described with reference to FIG. 18D.

The nucleation metal layer 194 may be formed by performing a CVD process by using a tungsten-containing gas and a plurality of types of reducing agents. In other embodiments, the tungsten-containing gas may include tungsten hexafluoride ($WF_6$), without being limited thereto. The plurality of types of reducing agents may include hydrogen ($H_2$) and at least one of a boron-containing reducing agent and a silicon-containing reducing agent. The boron-containing reducing agent may include diborane ($B_2H_6$), and the silicon-containing reducing agent may include silane ($SiH_4$), without being limited thereto.

After the nucleation metal layer 194 is formed, some of decomposition products of process gases used during the formation of the nucleation metal layer 194 may remain inside or on a surface of the nucleation metal layer 194. For example, reaction residues that are derived from the tungsten-containing gas (e.g., $WF_6$) and the reducing agent ($B_2H_6$, $SiH_4$, or a combination thereof) during the process of forming the nucleation metal layer 194 may remain irregularly dispersed inside or on the surface of the nucleation metal layer 194 as a heterogeneous material (refer to MPT in FIGS. 2D and 2E). The heterogeneous material MPT may include nonmetal or semimetal elements including at least one atom selected from a boron (B) atom, a silicon (Si) atom, and a fluorine (F) atom, without being limited thereto.

Figure 18D:
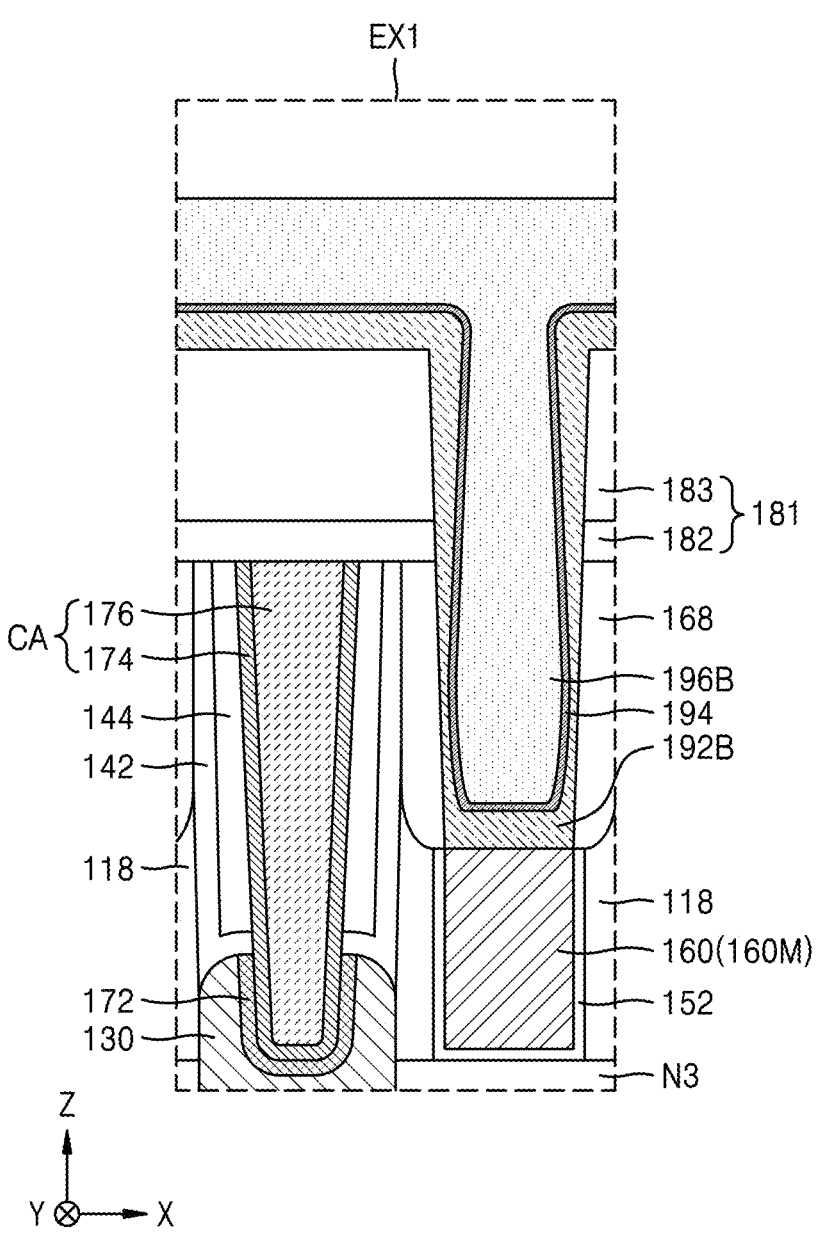
Figure 18E:
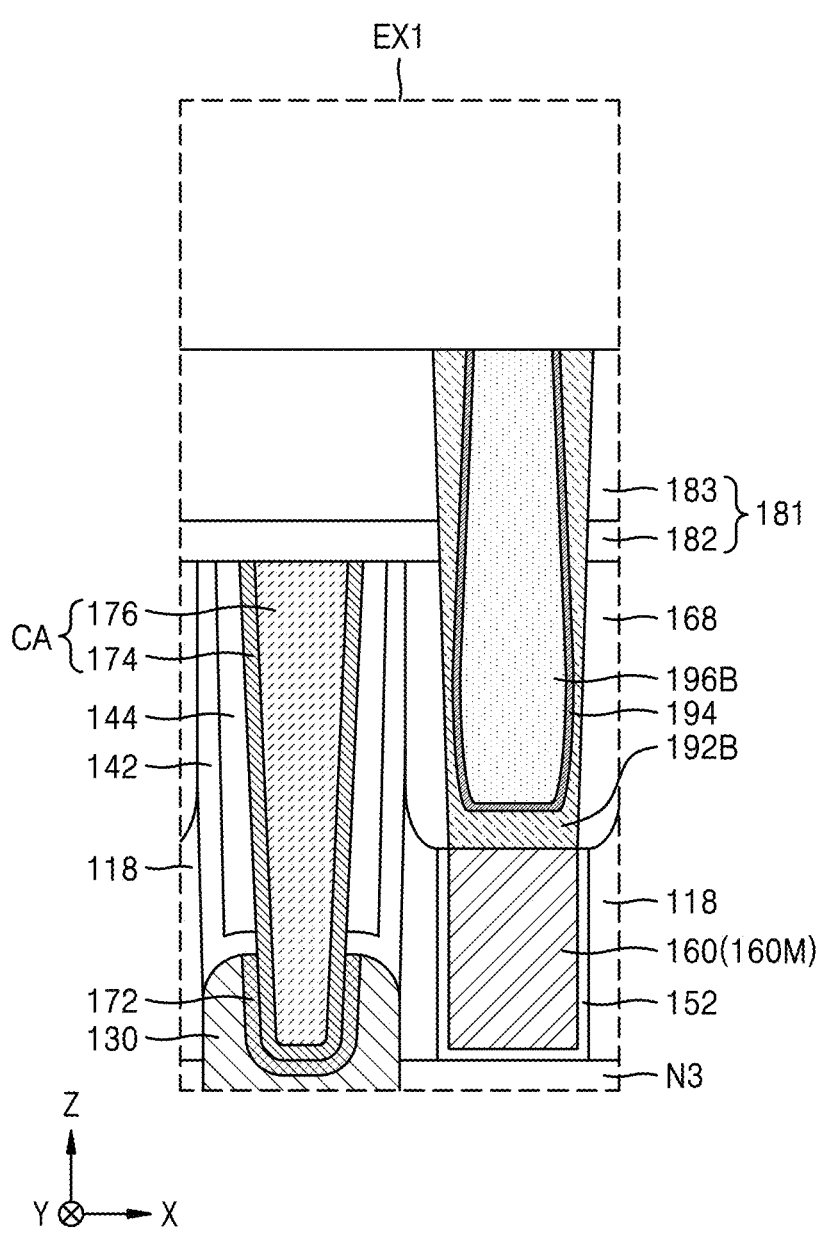

Referring to FIG. 18D, in the resultant structure of FIG. 18E, a second metal plug 196B may be formed on the nucleation metal layer 194. The second metal plug 196B may be formed on the nucleation metal layer 194 to such a sufficient thickness as to fill the gate contact hole H1. In other embodiments, the second metal plug 196B may include tungsten (W).

The second metal plug 196B may be formed by performing a CVD process using a tungsten-containing gas and a single type of reducing agent. In other embodiments, the tungsten-containing gas may include tungsten hexafluoride ($WF_6$), without being limited thereto. The reducing agent may include hydrogen ($H_2$).

Because the nucleation metal layer 194 is formed to a relatively uniform thickness inside the gate contact hole H1, even when the gate contact hole H1 has a relatively high aspect ratio, the second metal plug 196B may be formed to have excellent gap-fill characteristics inside the gate contact hole H1.

In other embodiments, while the second metal plug 196B is being formed by using the CVD process, the second metal plug 196B may be gradually grown on the nucleation metal layer 194 inside the gate contact hole H1, and portions of the second metal plug 196B, which are grown on the nucleation metal layer 194 on sidewalls of the gate contact hole H1 may meet each other in an inner central portion of the gate contact hole H1. As a result, after the second metal plug 196B is formed, a seam extending long in the vertical direction (Z direction) may remain inside the second metal plug 196B in a central portion of the gate contact hole H1.

Referring to FIG. 18E, in the resultant structure of FIG. 18D, from among the second metal liner 192B, the nucleation metal layer 194, and the second metal plug 196B, unnecessary portions covering the top surface of the middle insulating structure 181 may be removed by using a chemical mechanical polishing (CMP) process to expose the top surface of the middle insulating structure 181.

Figure 18F:
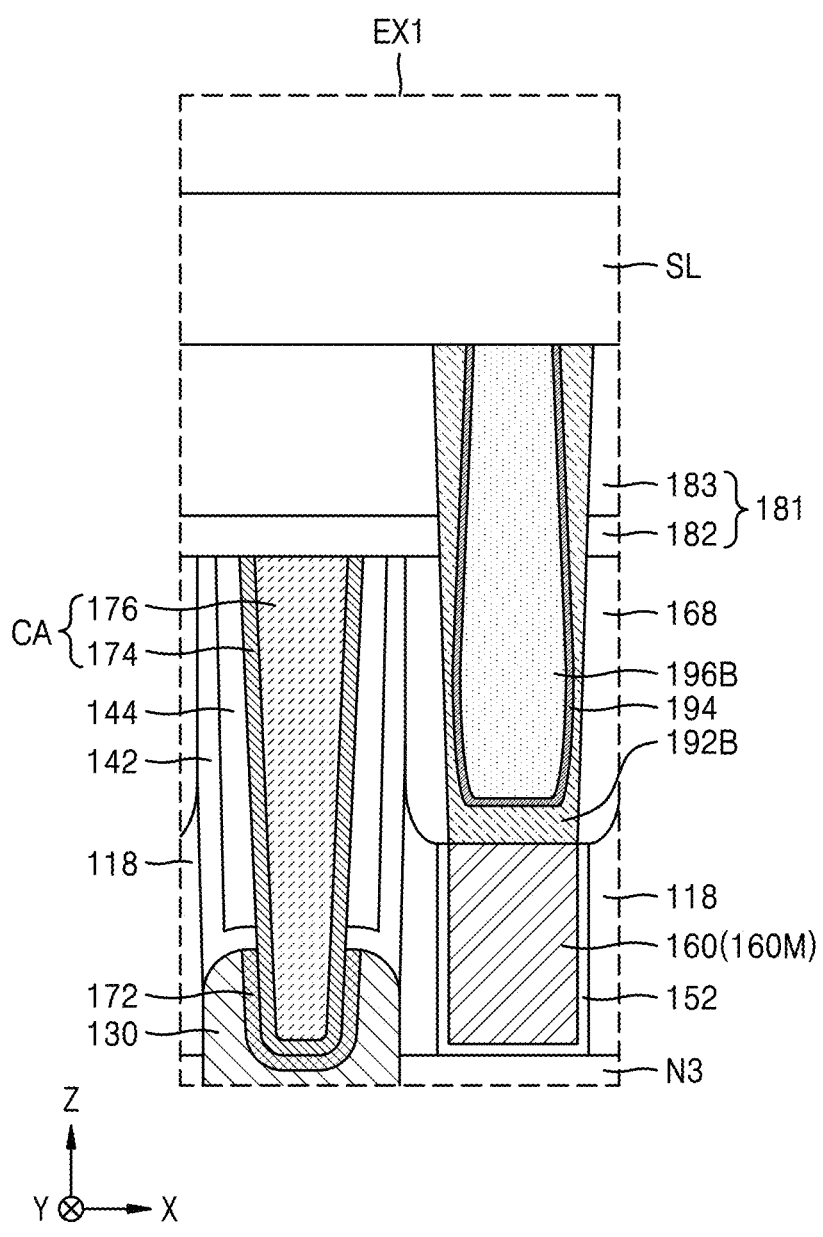

Referring to FIG. 18F, a sacrificial layer SL may be formed to cover the resultant structure of FIG. 18E. The sacrificial layer SL may include a silicon oxide film, without being limited thereto.

Figure 18G:
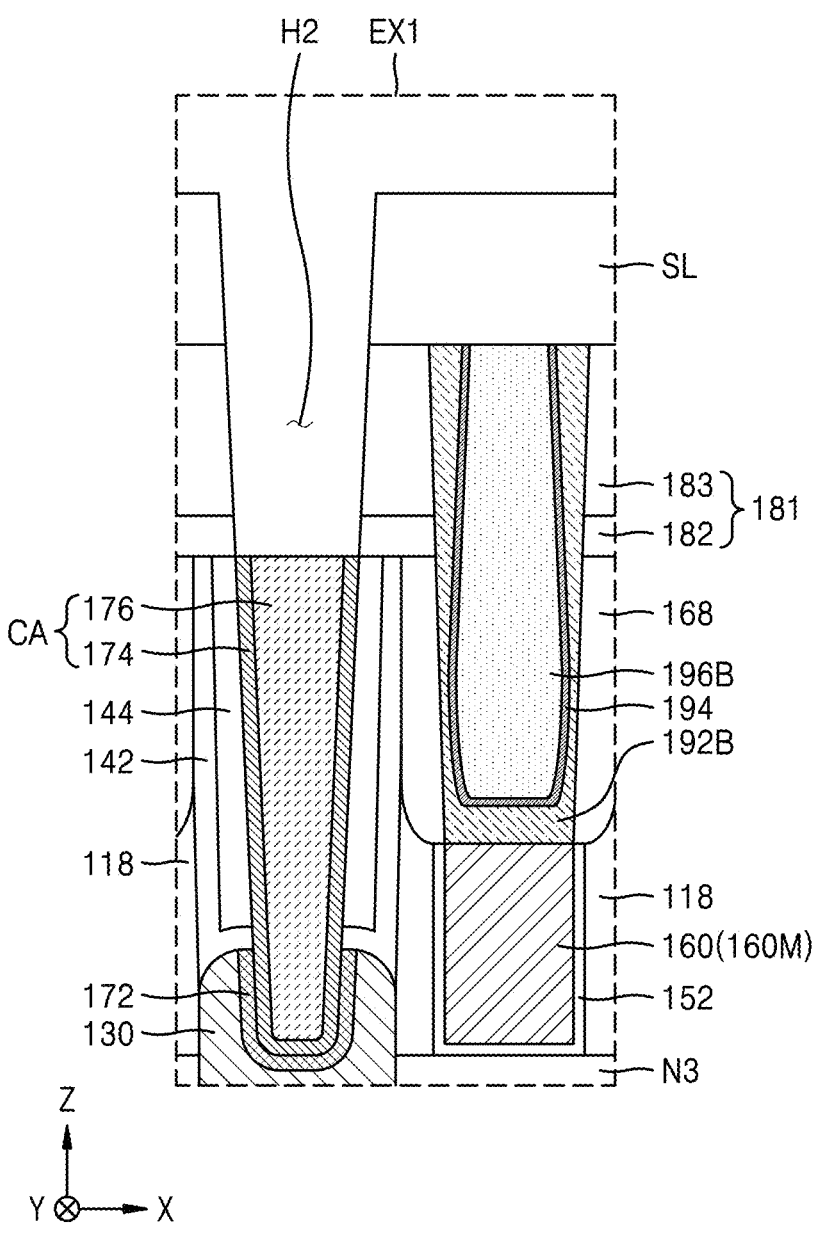

Referring to FIG. 18G, a mask pattern (not shown) may be formed on the resultant structure of FIG. 18F, and the sacrificial layer SL and the middle insulating structure 181 may be sequentially etched using the mask pattern as an etch mask to form a via contact hole H2 exposing a top surface of a source/drain contact CA. Thereafter, the mask pattern may be removed.

Figure 18H:
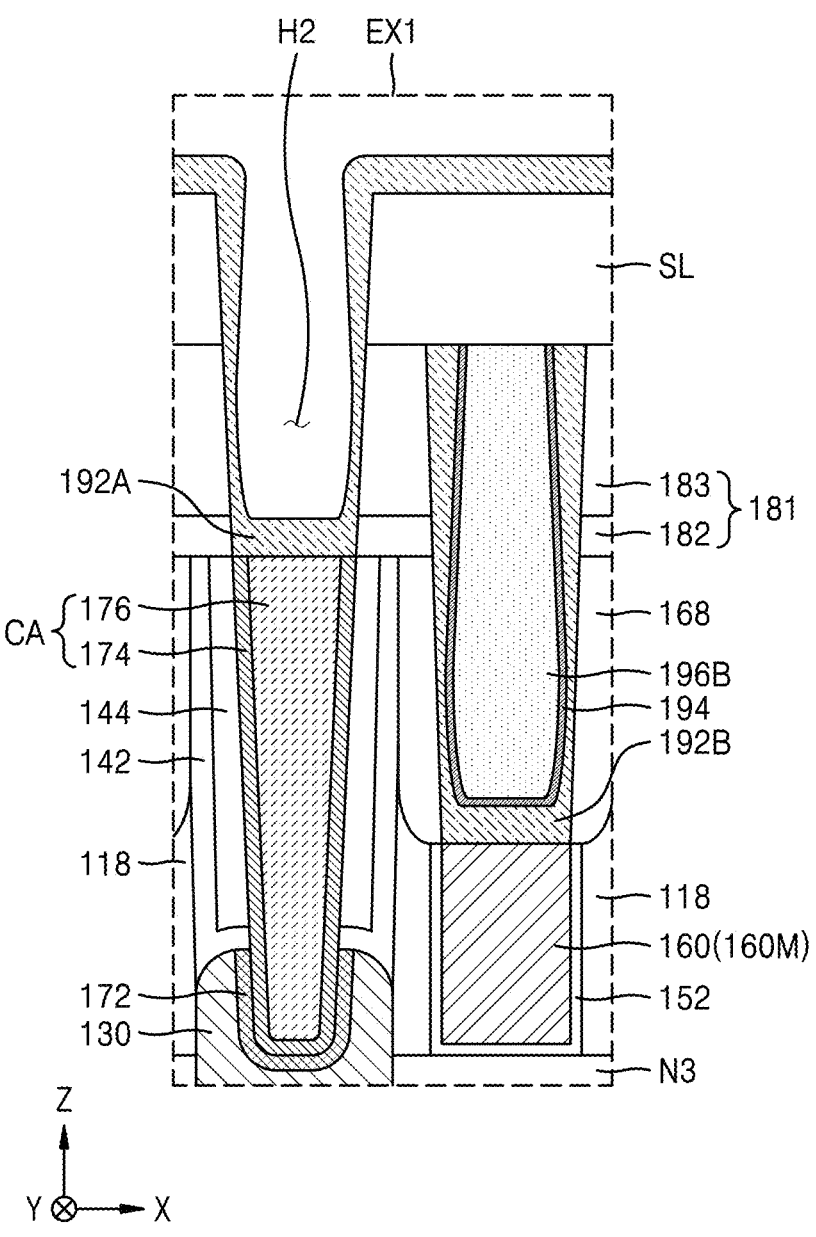

Referring to FIG. 18H, in the resultant structure of FIG. 18G, a first metal liner 192A may be formed to cover an inner surface of the via contact hole H2 and a top surface of the sacrificial layer SL. The first metal liner 192A may include tungsten (W).

In other embodiments, the first metal liner 192A may be formed by performing a PVD process using a tungsten target. As a result, the first metal liner 192A including tungsten (W) may be obtained.

In other embodiments, when the first metal liner 192A is formed by using the PVD process in a similar manner to the description of the process of forming the second metal liner 192B with reference to FIG. 18B, the first metal liner 192A formed on a surface of each of the sacrificial layer SL and the middle insulating structure 181 inside the via contact hole H2 may have a variable thickness in the vertical direction (Z direction). The first metal liner 192A may be formed to a relatively small thickness on the surface of each of the sacrificial layer SL and the capping insulating pattern 168 inside the via contact hole H2, while the first metal liner 192A may be formed to a relatively great thickness on the top surface of the source/drain contact CA. However, because the via contact hole H2 passes through the sacrificial layer SL and the middle insulating structure 181 in the vertical direction (Z direction), the via contact hole H2 may have a lower aspect ratio than the gate contact hole (refer to H1 in FIG. 18A). Accordingly, as compared to the second meal liner 192B formed inside the gate contact hole H1, the first metal liner 192A formed inside the via contact hole H2 may continuously extend from the bottom of the via contact hole H2 to an entrance thereof without being cut off or excessively thinned out, and provide good step coverage.

Figure 18I:
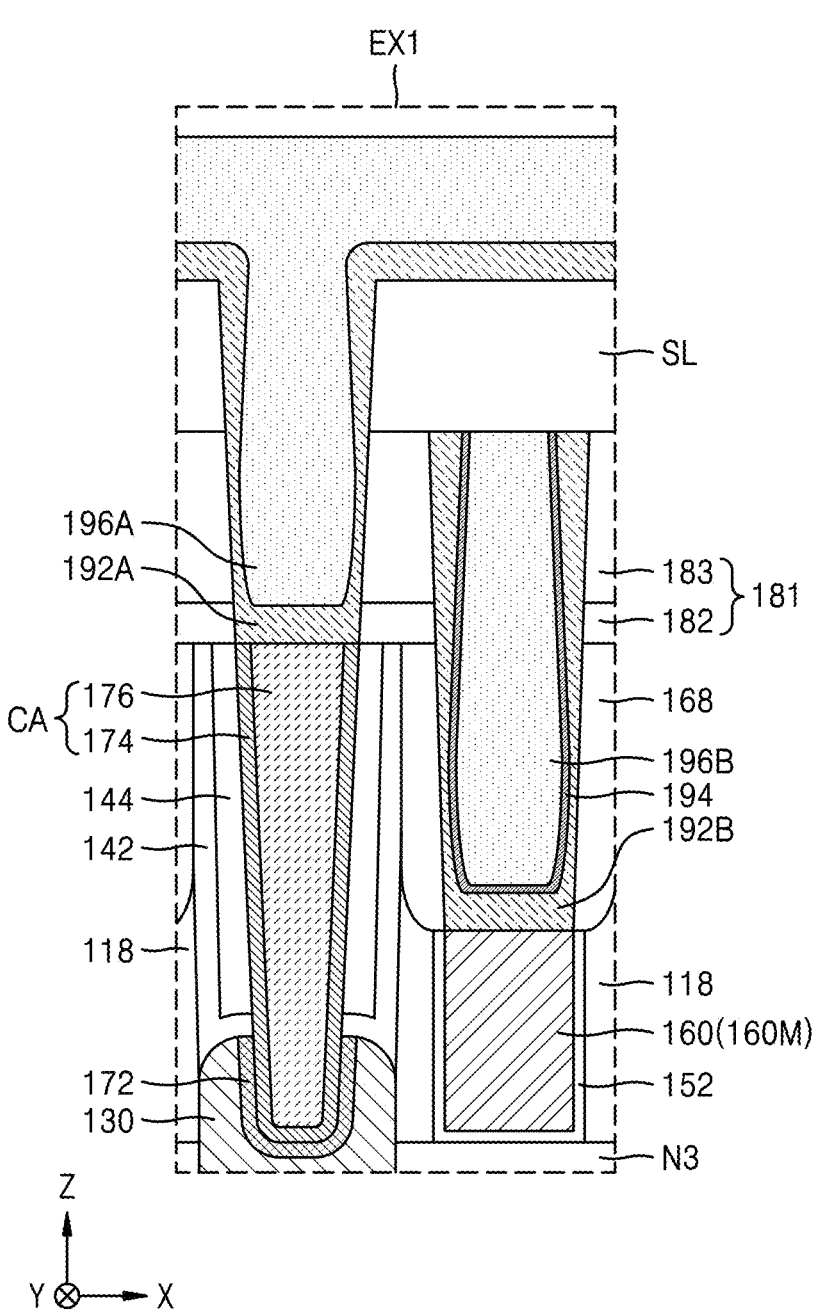

Referring to FIG. 18I, on the resultant structure of FIG. 18H, a first metal plug 196A may be formed on the first metal liner 192A. The first metal plug 196A may be formed to such a sufficient thickness as to fill the via contact hole H2 on the first metal liner 192A. In other embodiments, the first metal plug 196A may include tungsten (W).

The first metal plug 196A may be formed by performing a CVD process using a tungsten-containing gas and a single type of reducing agent. In other embodiments, the tungsten-containing gas may include tungsten hexafluoride ($WF_6$), without being limited thereto. The reducing agent may include hydrogen ($H_2$).

In other embodiments, while the first metal plug 196A is being formed by using a CVD process, the first metal plug 196A may be gradually grown on the first metal liner 192A inside the via contact hole H2, and portions of the first metal plug 196A, which are grown on the first metal liner 192A on sidewalls of the via contact hole H2, may meet each other in an inner central portion of the via contact hole H2. As a result, after the first metal plug 196A is formed, a seam extending long in the vertical direction (Z direction) may remain inside the first metal plug 196A in a central portion of the via contact hole H2.

Figure 18J:
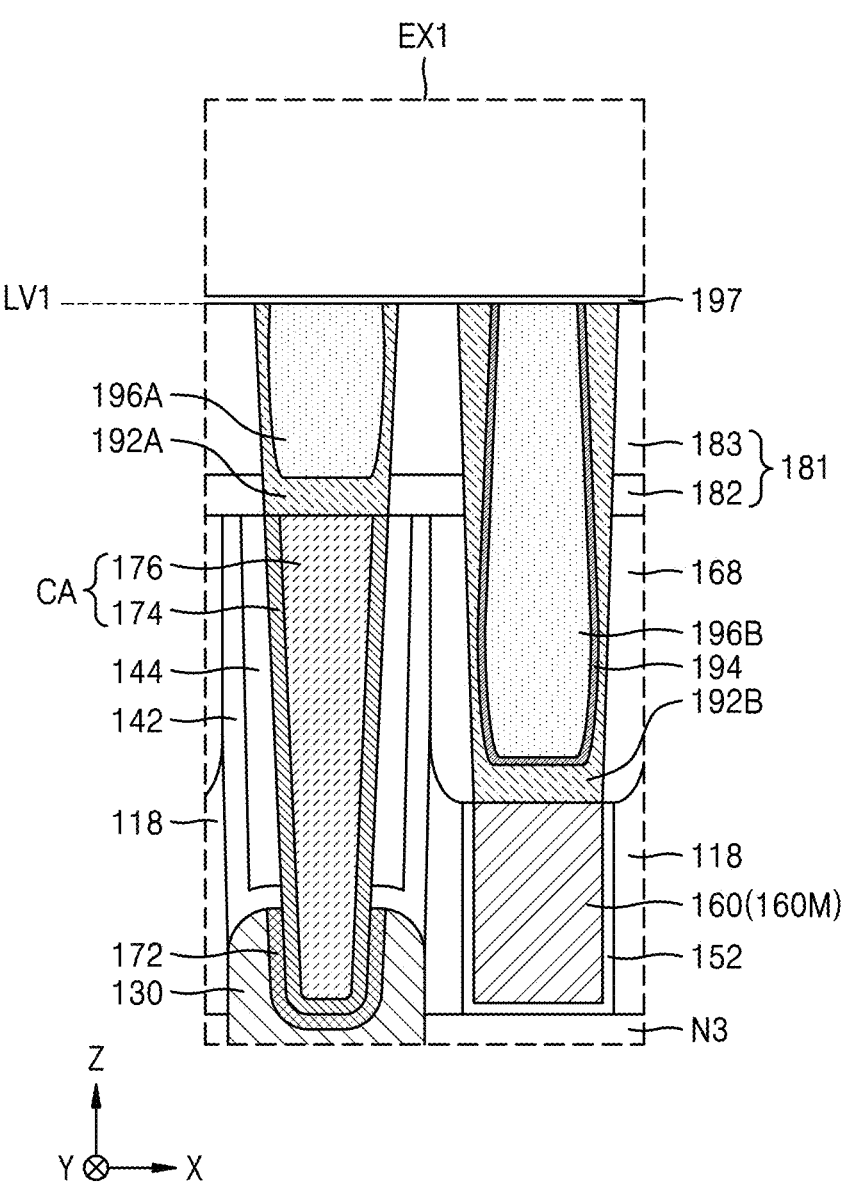

Referring to FIG. 18J, in the resultant structure of FIG. 18I, excessive portions of the first metal liner 192A and the first metal plug 196A, which are at a higher level than the top surface of the middle insulating structure 181, and the sacrificial layer SL may be removed by using a bulk CMP process.

After the bulk CMP process is performed, a polished surface remaining on the substrate 102 may have a relatively non-uniform topology. After a cleaning process that follows the bulk CMP process is performed, an oxide film 197, which is a thin film, may remain on the polished surface on the substrate 102.

Figure 18K:
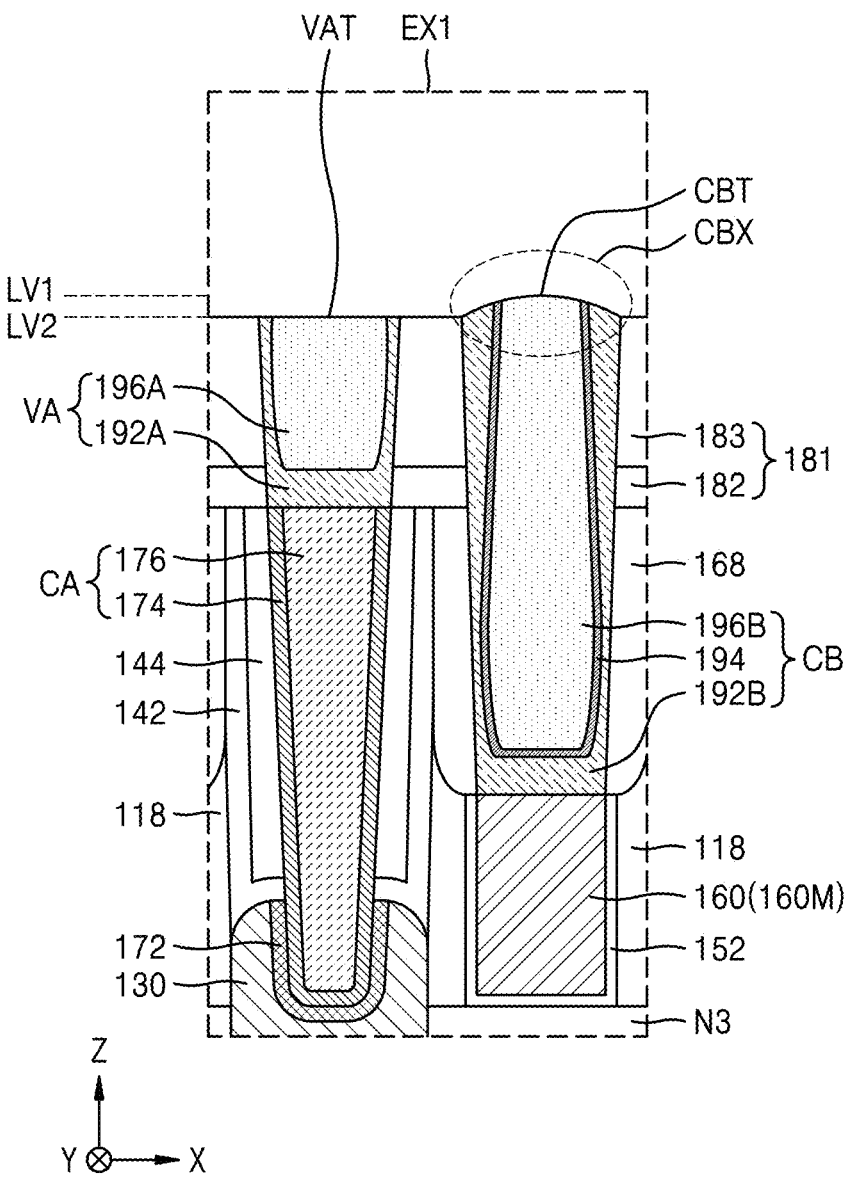

Referring to FIG. 18K, a buffing process may be performed on the polished surface, which is exposed in the resultant structure that has undergone the bulk CMP process described with reference to FIG. 18J. Thus, the top surface of the middle insulating structure 181 may be exposed, and the resultant structure in which the first contact structure VA and the second contact structure CB remain may be obtained.

The oxide film 197 and unnecessary fragments, which remain on the polished surface on the substrate 102 after the bulk CMP process described with reference to FIG. 18J, may be removed during the buffing process. Thus, a polished surface with a more uniform topology may be provided in each of the first contact structure VA, the second contact structure CB, and the middle insulating structure 181 may have. After the buffing process is completed, a vertical level LV2 of the top surface of each of the middle insulating structure 181 and the first contact structure VA may be lower than a vertical level (refer to LV1 in FIGS. 18I and 18J) of the top surface of each of the middle insulating structure 181, the first contact structure VA, and the second contact structure CB, which is obtained immediately after the bulk CMP process.

The buffing process may involve simultaneously polishing different materials because the first contact structure VA, the second contact structure CB, and the middle insulating structure 181 are simultaneously polished. Accordingly, it may be necessary to properly balance removal rates of the different materials to obtain the polished surface with the more uniform topology. To this end, the buffing process may be performed by using a polishing composition by which a removal rate of tungsten (W) included in the first and second contact structures VA and CB may become at substantially the same level as a removal rate of an oxide included in the middle insulating structure 181. For example, the buffing process may be performed by using a polishing composition including slurry including at least one of silica particles and alumina particles and water The alumina particles may be surface-coated with an anionic polymer. The anionic polymer may be selected from a carboxylic acid monomer unit, a sulfonic acid monomer unit, a phosphonic acid monomer unit, and a combination thereof. However, the polishing composition used in the buffing process is not limited to the examples described above and may be variously changed and modified within the scope of embodiments of inventive concepts.

To perform the buffing process, the second contact structure CB may further include a nucleation metal layer 194 unlike the first contact structure VA. The nucleation metal layer 194 may include a softer material than the second metal liner 192B and the second metal plug 196B. Therefore, during the buffing process, a difference in removal rate by the polishing composition used in the buffing process and a difference in reactivity with the polishing composition may occur between the second contact structure CB including the nucleation metal layer 194 and the first contact structure VA not including the nucleation metal layer 194. As a result, after the buffing process is completed, the first contact structure VA that does not include the nucleation metal layer 194 may have a first top surface VAT, which extends planar along an extension line of the top surface of the middle insulating structure 181. In contrast, after the buffing process is completed, the second contact structure CB including the nucleation metal layer 194 may have a second top surface CBT, which is convex from the top surface of the middle insulating structure 181 in a direction away from the substrate 102, and may have a planar shape in which the nucleation metal layer 194 is partially cut on the second top surface CBT as shown in FIG. 2E.

Thereafter, as shown in FIGS. 2A to 2E, an etch stop film 186 and an upper insulating film 187 may be sequentially formed on the resultant structure of FIG. 18K to form an upper insulating structure 185, and an upper wiring layer M1 may be formed to pass through the upper insulating structure 185. Thus, an IC device 100 may be manufactured.

Although the method of manufacturing the IC device 100 shown in FIGS. 1 and 2A to 2E has been described with reference to FIGS. 7A to 18K, it will be understood that the IC devices 100A, 200, and 300 shown in FIGS. 3 to 6B and IC devices having variously changed structures may be manufactured by applying various modifications and changes to the processes described with reference to FIGS. 7A to 18K within the scope of inventive concepts.

While some embodiments of inventive concepts have been particularly shown and described with reference to embodiments thereof, it will be understood that various changes in form and details may be made therein without departing from the spirit and scope of the following claims.

What is claimed is:

1. An integrated circuit device comprising:
   a substrate;
   a middle insulating structure on the substrate, the middle insulating structure having a top surface extending in a lateral direction at a first vertical level on the substrate;
   a first contact structure passing through the middle insulating structure in a vertical direction, the first contact structure extending by a first vertical length from the top surface of the middle insulating structure toward the substrate; and
   a second contact structure spaced apart from the first contact structure in the lateral direction, the second contact structure passing through the middle insulating structure in the vertical direction, and the second contact structure extending by a second vertical length from the top surface of the middle insulating structure toward the substrate, wherein the second vertical length is greater than the first vertical length, the first contact structure has a first top surface extending planar along an extension line of the top surface of the middle insulating structure, the second contact structure has a second top surface, and the second top surface is convex from the top surface of the middle insulating structure in a direction away from the substrate.

2. The integrated circuit device of claim 1, further comprising:

a gate line; and a source/drain region, wherein the substrate includes an active region below the first contact structure, the source/drain region is on the active region, the gate line is on the active region and extends in a direction intersecting the active region, the first contact structure is connected to the source/drain region, and the second contact structure is connected to the gate line.

3. The integrated circuit device of claim 1, further comprising:

a gate line;

a source/drain region;

a source/drain contact extending in the vertical direction between the source/drain region and the first contact structure; and a capping insulating pattern in contact with a top surface of the gate line, wherein the substrate includes a fin-type active region protruding from the substrate, the source/drain region is on the fin-type active region, the source/drain contact is connected to the source/drain region;

the gate line is spaced apart from the source/drain contact in the lateral direction, the gate line extending is on the fin-type active region in a direction intersecting with the fin-type active region, the capping insulating pattern is being between the gate line and the middle insulating structure, the first contact structure has a first bottom surface in contact with the source/drain contact, the second contact structure passes through the capping insulating pattern in the vertical direction, and the second contact structure has a second bottom surface in contact with the gate line.

4. The integrated circuit device of claim 1, wherein the first contact structure comprises a first metal liner and a first metal plug, the first metal liner is in contact with the middle insulating structure, the first metal liner includes a first metal, a bottom surface of the first metal plug and sidewalls of the first metal plug are surrounded by and in contact with the first metal liner, the first metal plug includes the first metal, the second contact structure comprises a second metal liner, a second metal plug, and a nucleation metal layer between the second metal liner and the second metal plug, the second metal liner is in contact with the middle insulating structure, a material of the second metal liner is same as a constituent material of the first metal liner, the second metal plug is surrounded by the second metal liner, at least a portion of the second metal plug is apart from the second metal liner, and a material of the second metal plug is the as the constituent material of the first metal plug, a material of the nucleation metal layer is same as a constituent material of the second metal liner.

5. The integrated circuit device of claim 1, wherein the first contact structure and the second contact structure each include a metal liner in contact with the middle insulating structure and a metal plug surrounded by the metal liner, the metal liner and the metal plug each comprise a first metal, the second contact structure comprises a nucleation metal layer between the metal liner of the second contact structure and the metal plug of the second contact structure, the nucleation metal layer comprises the first metal and nonmetal or semimetal elements irregularly dispersed in the nucleation metal layer, the first contact structure does not include the nucleation metal layer between the metal liner of the first contact structure and the metal plug of the first contact structure, and the nonmetal or semimetal elements include at least one of a boron (B) atom, a silicon (Si) atom, and a fluorine (F) atom.

6. The integrated circuit device of claim 5, wherein in the first contact structure, the metal liner of the first contact structure covers sidewalls of the metal plug of the first contact structure to a variable thickness as a distance from the substrate in the vertical direction increases, the metal liner of the first contact structure continuously extends in the vertical direction without being cut off on the sidewalls the metal plug of the first contact structure, and in the second contact structure, the metal liner of the second contact structure discontinuously extends in the vertical direction along an outer sidewall of the second contact structure such that the metal liner of the second contact structure is cut off in a lower local region of the second contact structure.

7. The integrated circuit device of claim 5, further comprising:

a capping insulating pattern between the substrate and the middle insulating structure, wherein a vertical level of the capping insulating pattern is lower than a vertical level of a bottom surface of the first contact structure, a lower portion of the second contact structure is surrounded by the capping insulating pattern, an upper portion of the second contact structure is surrounded by the middle insulating structure, in the first contact structure, the metal liner of the first contact structure continuously extends in the vertical direction without being cut off on sidewalls of the metal plug of the first contact structure such that the metal plug of the first contact structure does not comprise a portion in contact with the middle insulating structure, and in the second contact structure, the metal liner of the second contact structure discontinuously extends in the vertical direction along an outer sidewall of the second contact structure such that the metal liner of the second contact structure is cut off in a lower local region of the second contact structure, and in the lower local region of the second contact structure, the nucleation metal layer of the second contact structure is in contact with the capping insulating pattern.

8. The integrated circuit device of claim 1, wherein the first contact structure and the second contact structure each do not comprise a metal nitride film.

9. The integrated circuit device of claim 1, wherein an electrical resistance of the second contact structure is higher than an electrical resistance of the first contact structure.

10. The integrated circuit device of claim 1, wherein an aspect ratio of the second contact structure is higher than an aspect ratio of the first contact structure.

11. The integrated circuit device of claim 1, further comprising:

an upper insulating structure covering the first contact structure, the second contact structure, and the middle insulating structure, wherein the upper insulating structure comprises a first local bottom surface in contact with a top surface of the middle insulating structure and a second local bottom surface facing the second top surface of the second contact structure, the first local bottom surface is planar, and the second local bottom surface is concave toward the second top surface of the second contact structure.

12. An integrated circuit device comprising:

a substrate including a fin-type active region protruding from the substrate;

a source/drain region on the fin-type active region;

a gate line on the fin-type active region, the gate line extending in a direction intersecting the fin-type active region;

a lower insulating structure covering the source/drain region;

a source/drain contact passing through the lower insulating structure in a vertical direction, the source/drain contact being connected to the source/drain region;

a capping insulating pattern covering a top surface of the gate line;

a middle insulating structure on the source/drain contact and the capping insulating pattern;

a first contact structure passing through the middle insulating structure in the vertical direction, the first contact structure being connected to the source/drain contact; and a second contact structure passing through the middle insulating structure and the capping insulating pattern in the vertical direction, the second contact structure being connected to the gate line, wherein the first contact structure has a first top surface extending planar in an extension line of a top surface of the middle insulating structure, the second contact structure has a second top surface, and the second top surface is convex from the top surface of the middle insulating structure in a direction away from the substrate.

13. The integrated circuit device of claim 12, wherein the first contact structure comprises a first metal liner and a first metal plug, the first metal liner is in contact with the middle insulating structure, the first metal liner includes a first metal,

a bottom surface of the first metal plug and sidewalls of the first metal plug are surrounded by the first metal liner, the bottom surface of the first metal plug and the sidewalls of the first metal plug are in contact with the first metal liner, the first metal plug includes the first metal, wherein the second contact structure comprises a second metal liner, a second metal plug, and nucleation metal layer between the second metal liner and the second metal plug, the second metal liner is in contact with the middle insulating structure and the capping insulating pattern, a material of the second metal liner is same as a constituent material of the first metal liner, the second metal plug is surrounded by the second metal liner, at least a portion of the second metal plug is apart from the second metal liner, and a material of the second metal plug is same as a constituent material of the first metal plug, a material of the nucleation metal layer is same as a constituent material of the second metal liner, nonmetal or semimetal elements are irregularly dispersed in the nucleation metal layer, and the nonmetal or semimetal elements include at least one a boron (B) atom, a silicon (Si) atom, and a fluorine (F) atom.

14. The integrated circuit device of claim 13, wherein a thickness of the first metal liner in a lateral direction and a thickness of the second metal liner in the lateral direction each are variable as a distance from the substrate in the vertical direction increases, and a thickness of the nucleation metal layer in the lateral direction is constant as the distance from the substrate in the vertical direction increases.

15. The integrated circuit device of claim 12, wherein the second contact structure comprises a metal liner in contact with the middle insulating structure and the capping insulating pattern, a metal plug surrounded by the metal liner, and a nucleation metal layer between the metal liner and the metal plug, the metal liner includes a first metal, at least a portion of the metal plug having is apart from the metal liner, the metal plug includes the first metal, the nucleation metal layer includes the first metal, in a planar view, the nucleation metal layer has a shape discontinuously surrounding the metal plug in the second top surface of the second contact structure, and the second top surface of the second contact structure comprises a first portion where the metal liner is apart from the metal plug with the nucleation metal layer therebetween and a second portion where the metal liner is in contact with the metal plug.

16. The integrated circuit device of claim 12, wherein the first contact structure and the second contact structure each do not comprise a metal nitride film.

17. The integrated circuit device of claim 12, wherein an electrical resistance of the second contact structure is higher than an electrical resistance of the first contact structure.

18. The integrated circuit device of claim 12, further comprising:

an upper insulating structure covering the first contact structure, the second contact structure, and the middle insulating structure, wherein the upper insulating structure comprises a first local bottom surface in contact with the top surface of the middle insulating structure and a second local bottom surface facing the second top surface of the second contact structure, the first local bottom surface is planar, and the second local bottom surface is concave toward the second top surface.

19. The integrated circuit device of claim 12, further comprising:

an upper wiring layer in contact with the second top surface of the second contact structure, wherein a local bottom surface of the upper wiring layer is concave toward the second top surface of the second contact structure.

20. An integrated circuit device comprising:

a substrate;

a source/drain region on the substrate;

a gate line on the substrate;

a capping insulating pattern covering a top surface of the gate line;

a source/drain contact connected to the source/drain region;

a middle insulating structure on the source/drain contact and the capping insulating pattern;

a first contact structure passing through the middle insulating structure, the first contact structure being connected to the source/drain contact; and a second contact structure passing through the middle insulating structure and the capping insulating pattern, the second contact structure being connected to the gate line, wherein the first contact structure incudes a first tungsten liner in contact with the middle insulating structure and a first tungsten plug having a bottom surface and sidewalls in contact with the first tungsten liner, the first contact structure has a first top surface extending planar along an extension line of a top surface of the middle insulating structure, the second contact structure includes a second tungsten liner in contact with the middle insulating structure and the capping insulating pattern, a second tungsten plug having a bottom surface and sidewalls surrounded by the second tungsten liner, and a tungsten nucleation layer between the second tungsten liner and the second tungsten plug, the second contact structure has a second top surface, the second top surface is convex from the top surface of the middle insulating structure in a direction away from the substrate, and nonmetal or semimetal elements are irregularly dispersed in the tungsten nucleation layer.

* * * * *